(12) United States Patent
Zheng et al.

(10) Patent No.: US 11,448,965 B2
(45) Date of Patent: Sep. 20, 2022

(54) OPTICAL PATTERNING SYSTEMS AND METHODS

(71) Applicant: BOARD OF REGENTS, THE UNIVERSITY OF TEXAS SYSTEM, Austin, TX (US)

(72) Inventors: Yuebing Zheng, Austin, TX (US); Linhan Lin, Austin, TX (US); Jingang Li, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 17/262,015

(22) PCT Filed: Jul. 22, 2019

(86) PCT No.: PCT/US2019/042756
§ 371 (c)(1),
(2) Date: Jan. 21, 2021

(87) PCT Pub. No.: WO2020/023343
PCT Pub. Date: Jan. 30, 2020

(65) Prior Publication Data
US 2021/0311397 A1    Oct. 7, 2021

Related U.S. Application Data

(60) Provisional application No. 62/712,389, filed on Jul. 31, 2018, provisional application No. 62/702,126, filed on Jul. 23, 2018.

(51) Int. Cl.
*G03F 7/20* (2006.01)
*G03F 7/213* (2006.01)

(52) U.S. Cl.
CPC ............ *G03F 7/202* (2013.01); *G03F 7/2053* (2013.01); *G03F 7/213* (2013.01); *G03F 7/702* (2013.01); *G03F 7/704* (2013.01)

(58) Field of Classification Search
CPC ........ G03F 7/202; G03F 7/2053; G03F 7/213; G03F 7/702; G03F 7/704; G03F 7/0042;
(Continued)

(56) References Cited

U.S. PATENT DOCUMENTS

| 2005/0042430 A1 | 2/2005 | Toyoda |
| 2015/0163923 A1* | 6/2015 | Currie ................... H05K 3/027 29/846 |

(Continued)

OTHER PUBLICATIONS

International Search Report and Written Opinion for International Application No. PCT/US2019/042756 dated Oct. 3, 2019.
(Continued)

*Primary Examiner* — Mesfin T Asfaw
(74) *Attorney, Agent, or Firm* — Meunier Carlin & Curfman LLC

(57) ABSTRACT

Disclosed herein are methods for patterning two-dimensional atomic layer materials, the methods comprising: illuminating a first location of an optothermal substrate with electromagnetic radiation, wherein the optothermal substrate converts at least a portion of the electromagnetic radiation into thermal energy, and wherein the optothermal substrate is in thermal contact with a two-dimensional atomic layer material; thereby: generating an ablation region at a location of the two-dimensional atomic layer material proximate to the first location of the optothermal substrate, wherein at least a portion of the ablation region has a temperature sufficient to ablate at least a portion of the two-dimensional atomic layer material within the ablation region, thereby patterning the two-dimensional atomic layer material. Also disclosed herein are systems for performing the methods described herein, patterned two-dimensional atomic layer materials made by the methods described herein and methods of use thereof.

20 Claims, 32 Drawing Sheets

(58) Field of Classification Search
CPC ..... G03F 7/0043; B82Y 30/00; H05K 3/1208; H05K 3/125

See application file for complete search history.

(56) References Cited

U.S. PATENT DOCUMENTS

| | | | |
|---|---|---|---|
| 2016/0299435 A1* | 10/2016 | Ouyang | G03F 7/168 |
| 2017/0125268 A1* | 5/2017 | Dang | H01L 21/67092 |
| 2018/0236486 A1 | 8/2018 | Zheng et al. | |
| 2018/0275343 A1 | 9/2018 | Zheng et al. | |
| 2018/0348128 A1 | 12/2018 | Zheng et al. | |
| 2019/0113453 A1 | 4/2019 | Zheng et al. | |
| 2019/0195805 A1 | 6/2019 | Zheng et al. | |
| 2019/0264327 A1 | 8/2019 | Zheng et al. | |
| 2020/0264101 A1 | 8/2020 | Zheng et al. | |

OTHER PUBLICATIONS

Li et al., "Optothermal Nanoscissors for Versatile Low-Power Patterning of Atomic-Thin Two Dimensional Materials," 2018 Conference on Lasers and Electrooptics (CLEO); May 13-18, 2018.

Lin et al., "Optothermoplasmonic Nanolithography for On-Demand Patterning of 2D Materials," Adv. Funct. Mater., vol. 28, 1-9, 2018.

Ashkin, Arthur. "Applications of laser radiation pressure." Science 210.4474 (1980): 1081-1088.

Balandin, Alexander A. "Thermal properties of graphene and nanostructured carbon materials." Nature materials 10.8 (2011): 569-581.

Bhanu, Udai, et al. "Photoluminescence quenching in gold-MoS 2 hybrid nanoflakes." Scientific reports 4.1 (2014): 1-5, 5575.

Blöchl, Peter E. "Projector augmented-wave method." Physical review B 50.24 (1994): 17953.

Booth, H. J. "Recent applications of pulsed lasers in advanced materials processing." Thin Solid Films 453 (2004): 450-457.

Butler, Sheneve Z., et al. "Progress, challenges, and opportunities in two-dimensional materials beyond graphene." ACS nano 7.4 (2013): 2898-2926.

Castellanos-Gomez, Andres, et al. "Laser-thinning of MoS2: on demand generation of a single-layer semiconductor." Nano letters 12.6 (2012): 3187-3192.

Cho, Suyeon, et al. "Phase patterning for ohmic homojunction contact in MoTe2." Science 349.6248 (2015): 625-628.

Collet, Eric, et al. "Laser-induced ferroelectric structural order in an organic charge-transfer crystal." Science 300.5619 (2003): 612-615.

Cooper, Russell, et al. "Protection of polymer from atomic-oxygen erosion using Al2O3 atomic layer deposition coatings." Thin Solid Films 516.12 (2008): 4036-4039.

Das, Saptarshi, et al. "All two-dimensional, flexible, transparent, and thinnest thin film transistor." Nano letters 14.5 (2014): 2861-2866.

Fang, Hui, et al. "High-performance single layered WSe2 p-FETs with chemically doped contacts." Nano letters 12.7 (2012): 3788-3792.

Feng, Ji, et al. "Patterning of graphene." Nanoscale 4.16 (2012): 4883-4899.

Ferrari, Andrea C., et al. "Raman spectrum of graphene and graphene layers." Physical review letters 97.18 (2006): 187401.

Fox, Daniel S., et al. "Nanopatterning and electrical tuning of MoS2 layers with a subnanometer helium ion beam." Nano letters 15.8 (2015): 5307-5313.v.

Gao, Ping, et al. "Enhancing aspect profile of half-pitch 32 nm and 22 nm lithography with plasmonic cavity lens." Applied Physics Letters 106.9 (2015): 093110.

Glassbrenner, C. Jo, and Glen A. Slack. "Thermal conductivity of silicon and germanium from 3 K to the melting point." Physical Review 134.4A (1964): A1058.

Han, Gang Hee, et al. "Laser thinning for monolayer graphene formation: heat sink and interference effect." Acs Nano 5.1 (2011): 263-268.

He, X., T. DebRoy, and P. W. Fuerschbach. "Composition change of stainless steel during microjoining with short laser pulse." Journal of applied physics 96.8 (2004): 4547-4555.

Huang, Lujun, et al. "Atomically thin MoS2 narrowband and broadband light superabsorbers." ACS nano 10.8 (2016): 7493-7499.

Huang, Kai, et al. "Ultraviolet photoconductance of a single hexagonal WO 3 nanowire." Nano Research 3.4 (2010): 281-287.

Huang, Jian Yu, et al. "In situ observation of graphene sublimation and multi-layer edge reconstructions." Proceedings of the National Academy of Sciences 106.25 (2009): 10103-10108.

Ju, Long, et al. "Graphene plasmonics for tunable terahertz metamaterials." Nature nanotechnology 6.10 (2011): 630-634.

Katagiri, Y., et al. "Gate-tunable atomically thin lateral MoS2 schottky junction patterned by electron beam." Nano letters 16.6 (2016): 3788-3794.

Kim, Sang Jin, et al. "Materials for flexible, stretchable electronics: graphene and 2D materials." Annual Review of Materials Research 45 (2015): 63-84.

Koppens, F. H. L., et al. "Photodetectors based on graphene, other two-dimensional materials and hybrid systems." Nature nanotechnology 9.10 (2014): 780-793.

Kresse, Georg, and Jürgen Hafner. "Ab initio molecular dynamics for liquid metals." J of Non-Crystalline Solids 192 & 193, (1995): 222-229.

Kresse, Georg, and Jürgen Furthmüller. "Efficient iterative schemes for ab initio total-energy calculations using a plane-wave basis set." Physical review B 54.16 (1996): 11169.

Kresse, Georg, and Daniel Joubert. "From ultrasoft pseudopotentials to the projector augmented-wave method." Physical review b 59.3 (1999): 1758.

Lee, Changgu, et al. "Measurement of the elastic properties and intrinsic strength of monolayer graphene." science 321.5887 (2008): 385-388.

Lemme, Max C., et al. "Etching of graphene devices with a helium ion beam." ACS nano 3.9 (2009): 2674-2676.

Li, Zubin, et al. "Graphene plasmonic metasurfaces to steer infrared light." Scientific reports 5.1 (2015): 12423.

Lin, Linhan, et al. "Bubble-pen lithography." Nano letters 16.1 (2016): 701-708.

Lin, Linhan, et al. "Opto-thermoelectric nanotweezers." Nature photonics 12.4 (2018): 195-201.

Liu, Liqin, et al. "Batch fabrication of metasurface holograms enabled by plasmonic cavity lithography." Advanced Optical Materials 5.21 (2017): 1700429.

Liu, Li, et al. "Graphene oxidation: thickness-dependent etching and strong chemical doping." Nano letters 8.7 (2008): 1965-1970.

Luo, Xiangang, and Teruya Ishihara. "Surface plasmon resonant interference nanolithography technique." Applied Physics Letters 84.23 (2004): 4780-4782.

Ma, Wei, et al. "Dual-band light focusing using stacked graphene metasurfaces." ACS Photonics 4.7 (2017): 1770-1775.

Mezour, Mohamed A., Mario Morin, and Janine Mauzeroll. "Fabrication and characterization of laser pulled platinum microelectrodes with controlled geometry." Analytical chemistry 83.6 (2011): 2378-2382.

Mine, H., et al. "Laser-Beam-Patterned Topological Insulating States on Thin Semiconducting MoS 2." Physical review letters 123.14 (2019): 146803.

Pan, Liang, et al. "Maskless plasmonic lithography at 22 nm resolution." Scientific reports 1.1 (2011): 175.

Pan, Yusong, et al. "Threshold dependence of deep-and near-subwavelength ripples formation on natural MoS 2 induced by femtosecond laser." Scientific reports 6.1 (2016): 19571.

Paradisanos, I., et al. "Intense femtosecond photoexcitation of bulk and monolayer MoS2." Applied Physics Letters 105.4 (2014): 041108.

Perdew, John P., Kieron Burke, and Matthias Emzerhof. "Generalized gradient approximation made simple." Physical review letters 77.18 (1996): 3865.

Piech, A., et al. "Laser-induced heating and melting of gold nanoparticles studied by time-resolved x-ray scattering." Physical Review B 70.19 (2004): 195423.

(56) References Cited

OTHER PUBLICATIONS

Rodrigo, Daniel, et al. "Mid-infrared plasmonic biosensing with graphene." Science 349.6244 (2015): 165-168.

Sahin, Ramazan, Selcuk Akturk, and Ergun Simsek. "Quantifying the quality of femtosecond laser ablation of graphene." Applied Physics A 116.2 (2014): 555-560.

Sahin, R., E. Simsek, and S. Akturk. "Nanoscale patterning of graphene through femtosecond laser ablation." Applied Physics Letters 104.5 (2014): 053118.

Shi, Runbo, et al. "Scalable fabrication of graphene devices through photolithography." Applied Physics Letters 102.11 (2013): 113102.

Splendiani, Andrea, et al. "Emerging photoluminescence in monolayer MoS2." Nano letters 10.4 (2010): 1271-1275.

Srituravanich, Werayut, et al. "Plasmonic nanolithography." Nano letters 4.6 (2004): 1085-1088.

Stöhr, Rainer J., et al. "All-optical high-resolution nanopatterning and 3D suspending of graphene." ACS nano 5.6 (2011): 5141-5150.

Sun, Zhengzong, et al. "Growth of graphene from solid carbon sources." Nature 468.7323 (2010): 549-552.

Taniguchi, Shigeji, Toshio Shibata, and Katsuhiko Takeuchi. "Protectiveness of a CVD-Al2O3 film on TiAl intermetallic compound against high-temperature oxidation." Materials Transactions, JIM 32.3 (1991): 299-301.

Tsai, Meng-Lin, et al. "Monolayer MoS2 heterojunction solar cells." ACS nano 8.8 (2014): 8317-8322.

Tsuchiya, Masaru, Subramanian KRS Sankaranarayanan, and Shriram Ramanathan. "Photon-assisted oxidation and oxide thin film synthesis: A review." Progress in materials science 54.7 (2009): 981-1057.

Withers, F., et al. "Light-emitting diodes by band-structure engineering in van der Waals heterostructures." Nature materials 14.3 (2015): 301-306.

Xia, Fengnian, et al. "Two-dimensional material nanophotonics." Nature Photonics 8.12 (2014): 899-907.

Yan, H. J., et al. "First-principles study of the oxygen adsorption and dissociation on graphene and nitrogen doped graphene for Li-air batteries." Journal of Applied Physics 112.10 (2012): 104316.

Yoo, Jae-Hyuck, Eunpa Kim, and David J. Hwang. "Femtosecond laser patterning, synthesis, defect formation, and structural modification of atomic layered materials." MRS Bulletin 41.12 (2016): 1002-1008.

Zayats, Anatoly V., Igor I. Smolyaninov, and Alexei A. Maradudin. "Nano-optics of surface plasmon polaritons." Physics reports 408.3-4 (2005): 131-314.

Zhang, Xiaotian, et al. "Diffusion-controlled epitaxy of large area coalesced WSe2 monolayers on sapphire." Nano letters 18.2 (2018): 1049-1056.

\* cited by examiner

OPTICAL PATTERNING SYSTEMS AND METHODS

CROSS-REFERENCE TO RELATED APPLICATIONS

This application is a national stage application filed under 35 U.S.C. § 371 of PCT/US2019/042756 filed Jul. 22, 2019, which claims the benefit of priority to U.S. Provisional Application No. 62/702,126 filed Jul. 23, 2018 and U.S. Provisional Application No. 62/712,389 filed Jul. 31, 2018, which are hereby incorporated herein by reference in their entireties.

STATEMENT OF GOVERNMENT SUPPORT

This invention was made with government support under Grant No. CBET1704634 awarded by the National Science Foundation and Grant No. N00014-17-1-2424 awarded by the Office of Naval Research. The government has certain rights in the invention.

BACKGROUND

Since the first discovery of graphene, two-dimensional (2D) materials have drawn tremendous attention due to their atomic thickness and superior properties. Fabrication of high-quality micro-/nano-patterns of 2D materials is essential for their applications in both nanoelectronics and nanophotonics. The systems and methods discussed herein address these and other needs.

SUMMARY

Disclosed herein are methods and systems for patterning two-dimensional atomic layer materials. The methods can comprise illuminating a first location of an optothermal substrate with electromagnetic radiation; wherein the optothermal substrate converts at least a portion of the electromagnetic radiation into thermal energy; and wherein the optothermal substrate is in thermal contact with a two-dimensional atomic layer material; thereby: generating an ablation region at a location of the two-dimensional atomic layer material proximate to the first location of the optothermal substrate, wherein at least a portion of the ablation region has a temperature sufficient to ablate at least a portion of the two-dimensional atomic layer material within the ablation region; and ablating at least a portion of the two-dimensional atomic layer material within the ablation region proximate to the first location of the optothermal substrate; thereby patterning the two-dimensional atomic layer material.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE FIGURES

The accompanying figures, which are incorporated in and constitute a part of this specification, illustrate several aspects of the disclosure, and together with the description, serve to explain the principles of the disclosure.

FIG. 31 is almost the same, with only a minor change in the highest temperature (822 vs, 818, respectively). The power was 50 mW and the diameter of laser beam was 1 μm.

DETAILED DESCRIPTION

Figure 1:
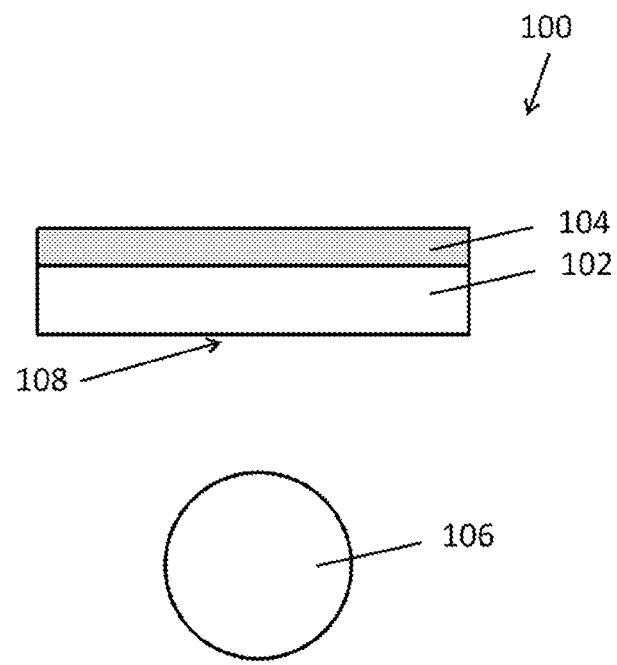
FIG. 1 is a schematic of an exemplary system as disclosed herein for patterning a two-dimensional material.

The systems and methods described herein may be understood more readily by reference to the following detailed description of specific aspects of the disclosed subject matter and the Examples included therein.

Before the present systems and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Herein, an all-optical lithographic technique, opto-thermoplasmonic nanolithography (OTNL), is developed to achieve high-throughput, versatile and maskless patterning of different atomic layers.

Disclosed herein are systems and methods for patterning a two-dimensional atomic layer material by optically controlled selective thermal ablation. Disclosed herein are methods of patterning a two-dimensional atomic layer material by selective thermal ablation thereof upon controlled exposure of an underlying optothermal substrate to electromagnetic radiation.

Disclosed herein are methods of patterning a two-dimensional atomic layer material, the methods comprising illuminating a first location of an optothermal substrate with electromagnetic radiation. As used herein, "a first location" and "the first location" are meant to include any number of locations in any arrangement on the optothermal substrate. Thus, for example "a first location" includes one or more first locations. In some embodiments, the first location can comprise a plurality of locations. In some embodiments, the first locations can comprise a plurality of locations arranged in an ordered array.

The electromagnetic radiation can, for example, have a power density of 15 mW/μm$^2$ or less (e.g., 14 mW/μm$^2$ or less, 13 mW/μm$^2$ or less, 12 mW/μm$^2$ or less, 11 mW/μm$^2$ or less, 10 mW/μm$^2$ or less, 9 mW/μm$^2$ or less, 8 mW/μm$^2$ or less, 7 mW/μm$^2$ or less, 6 mW/μm$^2$ or less, 5 mW/μm$^2$ or less, 4.5 mW/μm$^2$ or less, 4 mW/μm$^2$ or less, 3.5 mW/μm$^2$ or less, 3 mW/μm$^2$ or less, 2.5 mW/μm$^2$ or less, 2 mW/μm$^2$ or less, 1.5 mW/μm$^2$ or less, 1 mW/μm$^2$ or less, or 0.5 mW/μm$^2$ or less). In some examples, the electromagnetic radiation can have a power density of 0.1 mW/μm$^2$ or more (e.g., 0.5 mW/μm$^2$ or more, 1 mW/μm$^2$ or more, 1.5 mW/μm$^2$ or more, 2 W/μm$^2$ or more, 2.5 mW/μm$^2$ or more, 3 mW/μm$^2$ or more, 3.5 mW/μm$^2$ or more, 4 mW/μm$^2$ or more, 4.5 mW/μm$^2$ or more, 5 mW/μm$^2$ or more, 6 mW/μm$^2$ or more, 7 mW/μm$^2$ or more, 8 mW/μm$^2$ or more, 9 mW/μm$^2$ or more, 10 mW/μm$^2$ or more, 11 mW/μm$^2$ or more, 12 mW/μm$^2$ or more, or 13 mW/μm$^2$ or more). The power density of the electromagnetic radiation can range from any of the minimum values described above to any of the maximum values described above. For example, the electromagnetic radiation can have a power density of from 0.1 mW/μm$^2$ to 15 mW/μm$^2$ (e.g., from 0.1 mW/μm$^2$ to 7 mW/μm$^2$, from 7 mW/μm$^2$ to 15 mW/μm$^2$, from 0.1 mW/μm$^2$ to 10 mW/μm$^2$, from 0.1 mW/μm$^2$ to 5 mW/μm$^2$, or from 0.1 mW/μm$^2$ to 2.5 mW/μm$^2$).

The electromagnetic radiation can, for example, be provided by a light source. The light source can be any type of light source. Examples of suitable light sources include natural light sources (e.g., sunlight) and artificial light sources (e.g., incandescent light bulbs, light emitting diodes, gas discharge lamps, arc lamps, lasers etc.). In some examples, the light source is a laser, such as a continuous wave laser.

In some examples, the light source is configured to illuminate a mirror, the mirror being configured to reflect the electromagnetic radiation from the light source to illuminate the first location of the optothermal substrate. In some examples, the mirror can comprise a plurality of mirrors, such as an array of micromirrors (e.g., a digital micromirror device).

As used herein, an optothermal substrate is any substrate that can convert at least a portion of the electromagnetic radiation into thermal energy. For example, the optothermal substrate can comprise a material with a high absorption efficiency at one or more wavelengths that overlaps with at least a portion of the electromagnetic radiation. The optothermal substrate can, for example, comprise a material which has a high optothermal conversion efficiency. The optothermal substrate can, for example, comprise a plasmonic substrate, a metal substrate (e.g., a metal film), a dielectric substrate, or a combination thereof.

In some examples, the optothermal substrate comprises a plasmonic substrate and the electromagnetic radiation comprises a wavelength that overlaps with at least a portion of the plasmon resonance energy of the substrate.

The plasmonic substrate can, in some examples, comprise a plurality of plasmonic particles. In some examples, the plurality of plasmonic particles can comprise a plurality of metal particles. The plurality of metal particles can, for example, comprise a metal selected from the group consisting of Au, Ag, Pd, Pt, Cu, Cr, Al, Mg, Ni, and combinations thereof. In some examples, the plurality of plasmonic particles can comprise a plurality of gold particles.

The plurality of plasmonic particles can have an average particle size. "Average particle size" and "mean particle size" are used interchangeably herein, and generally refer to the statistical mean particle size of the particles in a population of particles. For example, the average particle size for a plurality of particles with a substantially spherical shape can comprise the average diameter of the plurality of particles. For a particle with a substantially spherical shape, the diameter of a particle can refer, for example, to the hydrodynamic diameter. As used herein, the hydrodynamic diameter of a particle can refer to the largest linear distance between two points on the surface of the particle. Mean particle size can be measured using methods known in the art, such as evaluation by scanning electron microscopy, transmission electron microscopy, and/or dynamic light scattering.

The plurality of plasmonic particles have, for example, an average particle size of 10 nm or more (e.g., 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 110 nm or more, 120 nm or more, 130 nm or more, 140 nm or more, 150 nm or more, 160 nm or more, 170 nm or more, 180 nm or more, 190 nm or more, 200 nm or more, 210 nm or more, 220 nm or more, 230 nm or more, 240 nm or more, 250 nm or more, 260 nm or more, 270 nm or more, 280 nm or more, or 290 nm or more).

In some examples, the plurality of plasmonic particles can have an average particle size of 300 nm or less (e.g., 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, or 15 nm or less).

The average particle size of the plurality of plasmonic particles can range from any of the minimum values described above to any of the maximum values described above. For example, the plurality of plasmonic particles can have an average particle size of from 10 nm to 300 nm (e.g., from 10 nm to 150 nm, from 150 nm to 300 nm, from 10 nm to 100 nm, from 100 nm to 200 nm, from 200 nm to 300 nm, from 10 nm to 200 nm, or from 10 nm to 50 nm).

In some examples, the plurality of plasmonic particles can be substantially monodisperse. "Monodisperse" and "homogeneous size distribution," as used herein, and generally describe a population of particles where all of the particles are the same or nearly the same size. As used herein, a monodisperse distribution refers to particle distributions in which 80% of the distribution (e.g., 85% of the distribution, 90% of the distribution, or 95% of the distribution) lies within 25% of the median particle size (e.g., within 20% of the median particle size, within 15% of the median particle size, within 10% of the median particle size, or within 5% of the median particle size).

The plurality of plasmonic particles can comprise particles of any shape (e.g., a sphere, a rod, a quadrilateral, an ellipse, a triangle, a polygon, etc.). In some examples, the plurality of plasmonic particles can have an isotropic shape. In some examples, the plurality of plasmonic particles can have an anisotropic shape. In some examples, the plurality of plasmonic particles are substantially spherical.

In some examples, each plasmonic particle within the plurality of plasmonic particles on the substrate is separated from its neighboring plasmonic particles by an average distance of 5 nm or more (e.g., 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 250 nm or more, 300 nm or more, 350 nm or more, 400 nm or more, 450 nm or more, 500 nm or more, 600 nm or more, 700 nm or more, 800 nm or more, 900 nm or more, 1 micrometer (micron, μm) or more, 2 μm or more, 3 μm or more, 4 μm or more, or 5 μm or more).

In some examples, each plasmonic particle within the plurality of plasmonic particles on the substrate is separated from its neighboring plasmonic particles by an average distance of 10 micrometers (microns, μm) or less (e.g., 9 μm or less, 8 μm or less, 7 μm or less, 6 μm or less, 5 μm or less, 4 μm or less, 3 μm or less, 2 μm or less, 1 μm or less, 900 nm or less, 800 nm or less, 700 nm or less, 600 nm or less, 500 nm or less, 450 nm or less, 400 nm or less, 350 nm or less, 300 nm or less, 250 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, or 10 nm or less).

The average distance that each plasmonic particle within the plurality of plasmonic particles on the substrate is separated from its neighboring plasmonic particles can range from any of the minimum values described above to any of the maximum values described above. For example, each plasmonic particle within the plurality of plasmonic particles on the substrate is separated from its neighboring plasmonic particles by an average distance of from 5 nm to 10 μm (e.g., from 5 nm to 5 µm, from 5 nm to 1 µm, from 5 nm to 500 nm, from 5 nm to 250 nm, from 5 nm to 100 nm, or from 5 nm to 50 nm).

The density of the plurality of plasmonic particles on the plasmonic substrate can, for example, be $10^6$ particles/cm$^2$ or more (e.g., $5\times10^6$ particles/cm$^2$ or more, $1\times10^7$ particles/cm$^2$ or more, $5\times10^7$ particles/cm$^2$ or more, $1\times10^8$ particles/cm$^2$ or more, $5\times10^8$ particles/cm$^2$ or more, $1\times10^9$ particles/cm$^2$ or more, $5\times10^9$ particles/cm$^2$ or more, $1\times10^{10}$ particles/cm$^2$ or more, or $5\times10^{10}$ particles/cm$^2$ or more). In some examples, the density of the plurality of plasmonic particles on the plasmonic substrate can be $10^{11}$ particles/cm$^2$ or less (e.g., $5\times10^{10}$ particles/cm$^2$ or less, $1\times10^{10}$ particles/cm$^2$ or less, $5\times10^9$ particles/cm$^2$ or less, $1\times10^9$ particles/cm$^2$ or less, $5\times10^8$ particles/cm$^2$ or less, $1\times10^8$ particles/cm$^2$ or less, $5\times10^7$ particles/cm$^2$ or less, $1\times10^7$ particles/cm$^2$ or less, or $5\times10^6$ particles/cm$^2$ or less).

The density of the plurality of plasmonic particles on the plasmonic substrate can range from any of the minimum values described above to any of the maximum values described above. For example, the density of the plurality of plasmonic particles on the plasmonic substrate can be from $10^6$ particles/cm$^2$ to $10^{11}$ particles/cm$^2$ (e.g., from $1\times10^6$ particles/cm$^2$ to $5\times10^8$ particles/cm$^2$, from $5\times10^8$ particles/cm$^2$ to $1\times10^{11}$ particles/cm$^2$, from $1\times10^7$ particles/cm$^2$ to $1\times10^{11}$ particles/cm$^2$, from $1\times10^8$ particles/cm$^2$ to $1\times10^{11}$ particles/cm$^2$, from $1\times10^9$ particles/cm$^2$ to $1\times10^{11}$ particles/cm$^2$, or from $1\times10^{10}$ particles/cm$^2$ to $1\times10^{11}$ particles/cm$^2$).

The size, shape, and/or composition of the plurality of plasmonic particles; the separation between each particle within the plurality of plasmonic particles; the density of the plasmonic particles on the substrate; or combinations thereof can be selected in view of a variety of factors. In some examples, the size, shape, and/or composition of the plurality of plasmonic particles can be selected to maximize the electromagnetic field enhancement. For example, the size, shape, and/or composition of the plurality of plasmonic particles; the separation between each particle within the plurality of plasmonic particles; the density of the plasmonic particles on the substrate; or combinations thereof can be selected such that the intensity of an incident electromagnetic field is enhanced by a factor of 5 or more by the plurality of plasmonic particles (e.g., 10 or more, 20 or more, 30 or more, 40 or more, 50 or more, 60 or more 70 or more, 80 or more, 90 or more, or 100 or more). In some examples, the size, shape, and/or composition of the plurality of plasmonic particles; the separation between each particle within the plurality of plasmonic particles; the density of the plasmonic particles on the substrate; or combinations thereof can be selected such that the plasmon resonance energy of the plasmonic substrate overlaps with at least a portion of the electromagnetic radiation used to illuminate the plasmonic substrate.

The methods can further comprise, for example, making the plasmonic substrate by depositing the plurality of plasmonic particles on a substrate. Depositing the plurality of plasmonic particles can comprise, for example, printing, lithographic deposition, electron beam deposition, thermal deposition, spin coating, drop-casting, zone casting, dip coating, blade coating, spraying, vacuum filtration, or combinations thereof.

The methods can further comprise, for example, making the plasmonic substrate by thermally annealing a film of a plasmonic metal deposited on a substrate, thereby forming the plurality of plasmonic particles on the substrate. In some examples, the methods can further comprise depositing the film of the plasmonic metal on the substrate. The film of plasmonic metal can be deposited on the substrate, for example, by thin film processing techniques, such as sputtering, pulsed layer deposition, molecular beam epitaxy, evaporation, atomic layer deposition, or combinations thereof.

In some examples, the film of the plasmonic metal can have a thickness of 2 nm or more (e.g., 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, or 80 nm or more). In some examples, the film of the plasmonic metal can have a thickness of 100 nm or less (e.g., 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, 5 nm or less, 4.5 nm or less, 4 nm or less, 3.5 nm or less, or 3 nm or less). The thickness of the film of the plasmonic metal can range from any of the minimum values described above to any of the maximum values described above. For example, the film of the plasmonic metal can have a thickness of from 2 nm to 100 nm (e.g., from 1 nm to 50 nm, from 50 nm to 100 nm, from 1 nm to 20 nm, from 20 nm to 40 nm, from 40 nm to 60 nm, from 60 nm to 80 nm, from 80 nm to 100 nm, from 2 nm to 80 nm, from 2 nm to 60 nm, from 2 nm to 40 nm, from 2 nm to 20 nm, or from 2 nm to 10 nm).

Thermally annealing the film can, for example, comprise heating the film at a temperature of 400° C. or more (e.g., 410° C. or more, 420° C. or more, 430° C. or more, 440° C. or more, 450° C. or more, 460° C. or more, 470° C. or more, 480° C. or more, 490° C. or more, 500° C. or more, 510° C. or more, 520° C. or more, 530° C. or more, 540° C. or more, 550° C. or more, 560° C. or more, 570° C. or more, 580° C. or more, or 590° C. or more). In some examples, thermally annealing the film can comprise heating the film at a temperature of 600° C. or less (e.g., 590° C. or less, 580° C. or less, 570° C. or less, 560° C. or less, 550° C. or less, 540° C. or less, 530° C. or less, 520° C. or less, 510° C. or less, 500° C. or less, 490° C. or less, 480° C. or less, 470° C. or less, 460° C. or less, 450° C. or less, 440° C. or less, 430° C. or less, 420° C. or less, or 410° C. or less). The temperature at which the film is heated during thermal annealing can range from any of the minimum values described above to any of the maximum values described above. For example, thermally annealing the film can comprise heating the film at a temperature of from 400° C. to 600° C. (e.g., from 400° C. to 500° C., from 500° C. to 600° C., from 450° C. to 600° C., from 500° C. to 600° C., from 510° C. to 590° C., from 520° C. to 580° C., from 530° C. to 570° C., or from 540° C. to 560° C.). In some examples, thermally annealing the film can comprise heating the film at a temperature of 550° C.

In some examples, the film can be thermally annealed for 0.5 hours or more (e.g., 0.75 hours or more, 1 hour or more, 1.25 hours or more, 1.5 hours or more, 1.75 hours or more, 2 hours or more, 2.5 hours or more, 3 hours or more, 3.5 hours or more, 4 hours or more, 4.5 hours or more, 5 hours or more, 5.5 hours or more, 6 hours or more, 6.5 hours or more, 7 hours or more, 7.5 hours or more, 8 hours or more, 8.5 hours or more, 9 hours or more, 9.5 hours or more, 10 hours or more, 10.5 hours or more, 11 hours or more, 11.5 hours or more, 12 hours or more, 13 hours or more, 14 hours or more, 15 hours or more, 16 hours or more, 17 hours or more, 18 hours or more, 19 hours or more, 20 hours or more, 21 hours or more, or 22 hours or more). In some examples, the film can be thermally annealed for 24 hours or less (e.g., 23 hours or less, 22 hours or less, 21 hours or less, 20 hours or less, 19 hours or less, 18 hours or less, 17 hours or less, 16 hours or less, 15 hours or less, 14 hours or less, 13 hours or less, 12 hours or less, 11.5 hours or less, 11 hours or less, 10.5 hours or less, 10 hours or less, 9.5 hours or less, 9 hours or less, 8.5 hours or less, 8 hours or less, 7.5 hours or less, 7 hours or less, 6.5 hours or less, 6 hours or less, 5.5 hours or less, 5 hours or less, 4.5 hours or less, 4 hours or less, 3.5 hours or less, 3 hours or less, 2.5 hours or less, 2 hours or less, 1.5 hours or less, or 1 hour or less). The time for which the film can be thermally annealed can range from any of the minimum values described above to any of the maximum values described above. For example, the film can be thermally annealed for from 0.5 hour to 24 hours (e.g., from 0.5 hours to 12 hours, from 12 hours to 24 hours, from 0.5 hours to 6 hours, from 6 hours to 12 hours, from 12 hours to 18 hours, from 18 hours to 24 hours, or from 1 hour to 18 hours). In some examples, the film can be thermally annealed for 2 hours.

In some examples, the optothermal substrate can comprise a metal film, such as a metal film deposited on a substrate. The metal film can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal film can comprise a metal selected from the group consisting of Al, Ti, Cr, Mn, Fe, Co, Ni, Cu, Mo, Pd, Ag, Cd, Pt, Au, Mg, and combinations thereof. In some examples, the methods can further comprise making the optothermal substrate by depositing the metal film on a substrate. The metal film can be deposited on the substrate, for example, by thin film processing techniques, such as sputtering, pulsed layer deposition, molecular beam epitaxy, evaporation, thermal deposition, atomic layer deposition, or combinations thereof.

In some examples, the metal film can have a thickness of 2 nm or more (e.g., 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, or 80 nm or more). In some examples, the metal film can have a thickness of 100 nm or less (e.g., 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, 5 nm or less, 4.5 nm or less, 4 nm or less, 3.5 nm or less, or 3 nm or less). The thickness of the metal film can range from any of the minimum values described above to any of the maximum values described above. For example, the metal film can have a thickness of from 2 nm to 100 nm (e.g., from 1 nm to 50 nm, from 50 nm to 100 nm, from 1 nm to 20 nm, from 20 nm to 40 nm, from 40 nm to 60 nm, from 60 nm to 80 nm, from 80 nm to 100 nm, from 2 nm to 80 nm, from 2 nm to 60 nm, from 2 nm to 40 nm, from 2 nm to 20 nm, or from 2 nm to 10 nm). The optothermal substrate is in thermal contact with a two-dimensional atomic layer material. In some examples, the two-dimensional atomic layer material is disposed on the optothermal substrate. In some examples, the two-dimensional atomic layer material is disposed on the optothermal substrate such that the two-dimensional atomic layer material is in physical contact with the optothermal substrate.

The two-dimensional atomic layer material can, for example, comprise a transition metal dichalcogenide, hexagonal BN, graphene, black phosphorous, or combinations thereof. In some examples, the two-dimensional atomic layer material can comprise a transition metal dichalcogenide selected from the group consisting of $MoS_2$, $WSe_2$, $MoTe_2$, $WS_2$, and combinations thereof.

In some examples, the methods can further comprise forming the two-dimensional atomic layer material. In some examples, the methods can further comprise disposing the two-dimensional atomic layer material proximate the optothermal substrate such that the optothermal substrate is in thermal contact with the two-dimensional atomic layer material.

The methods further comprise generating an ablation region at a location of the two-dimensional atomic layer material proximate to the first location of the optothermal substrate, wherein at least a portion of the ablation region has a temperature sufficient to ablate at least a portion of the two-dimensional atomic layer material within the ablation region. For example, the ablation region is located within at least a portion of a three-dimensional area defined by a temperature gradient (e.g., the boundary of the ablation region can be defined by the temperature gradient). The ablation region can comprise a three-dimensional area within the liquid sample where at least a portion of the ablation region has a temperature sufficient to ablate at least a portion of the two-dimensional atomic layer material within the ablation region. In some examples, wherein the optothermal substrate comprises a plasmonic substrate, the ablation region can be generated by plasmon-enhanced photothermal effects.

The ablation region can have an average diameter, within the plane of the two dimensional atomic layer material, of 300 nm or more (e.g., 350 nm or more, 400 nm or more, 450 nm or more, 500 nm or more, 550 nm or more, 600 nm or more, 650 nm or more, 700 nm or more, 750 nm or more, 800 nm or more, 850 nm or more, 900 nm or more, 950 nm or more, 1 µm or more, 2 µm or more, 3 µm or more, 4 µm or more, 5 µm or more, 6 µm or more, 7 µm or more, or 8 µm or more). In some examples, the ablation region can have an average diameter, within the plane of the two dimensional atomic layer material, of 10 µm or less (e.g., 9 µm or less, 8 µm or less, 7 µm or less, 6 µm or less, 5 µm or less, 4 µm or less, 3 µm or less, 2 µm or less, 1 µm or less, 950 nm or less, 900 nm or less, 850 nm or less, 800 nm or less, 750 nm or less, 700 nm or less, 650 nm or less, 600 nm or less, 550 nm or less, 500 nm or less, 450 nm or less, or 400 nm or less). The average diameter of the ablation region within the plane of the two-dimensional atomic layer material can range from any of the minimum values described above to any of the maximum values described above. For example, the ablation region can have a diameter, within the plane of the two dimensional atomic layer material, of from 300 nm to 10 µm (e.g., from 300 nm to 1 µm, from 1 µm to 10 µm, from 300 nm to 8 µm, from 300 nm to 5 µm, or from 500 µm to 7 µm). The diameter of the ablation region can, for example, be controlled by the power density of the electromagnetic radiation used to illuminate the optothermal substrate. The diameter of the ablation region can be selected in view of a number of factors. In some examples, the diameter of the ablation region can be selected relative to the desired average size of the portion of the two-dimensional atomic layer material to be ablated.

The methods further comprise ablating at least a portion of the two-dimensional atomic layer material within the ablation region proximate to the first location of the optothermal substrate, thereby patterning the two-dimensional atomic layer material. In some examples, ablating at least a portion of the two-dimensional atomic layer material can comprise thermally induced oxidation of the portion of the two-dimensional atomic layer material; sublimation of the portion of the two-dimensional atomic layer material; or a combination thereof.

As used herein, "a portion" of the two-dimensional atomic layer material, "the portion" of the two-dimensional atomic layer material, "an ablated portion" of the two-dimensional atomic layer material, and "the ablated portion" of the two-dimensional atomic layer material are meant to include any number of portions of the two-dimensional atomic layer material in any arrangement. Thus, for example, "a portion" includes one or more portions. In some examples, the ablated portion of the two-dimensional atomic layer material ablated can comprise a plurality of ablated portions of the two-dimensional atomic layer material. In some examples, the ablated portion of the two-dimensional atomic layer material can comprise a plurality of ablated portions in an ordered array.

The ablated portion of the two-dimensional atomic layer material can have an average size and shape. The size and/or shape of the ablated portion of the two-dimensional atomic layer material can be selected in view of a number of factors, such as the power density of the electromagnetic radiation, the composition and properties of the optothermal substrate, the composition of the two-dimensional atomic layer material, the amount of time the first location of the optothermal substrate is illuminated with the electromagnetic radiation, the diameter of the ablation region, or a combination thereof. In some examples, the ablated portion of the two-dimensional atomic layer material can comprise a plurality of ablated portions, and the plurality of ablated portions can be substantially monodisperse.

In some examples, the ablated portion of the two-dimensional atomic material can be ablated in an amount of time of $10^{-4}$ seconds or more (e.g., $5 \times 10^{-4}$ seconds or more, $1 \times 10^{-3}$ seconds or more, $5 \times 10^{-3}$ seconds or more, $1 \times 10^{-2}$ seconds or more, $5 \times 10^{-2}$ seconds or more, 0.1 seconds or more, 0.5 seconds or more, 1 second or more, or 5 seconds or more). In some examples, the ablated portion of the two-dimensional atomic material can be ablated in an amount of time of 10 seconds or less (e.g., 5 seconds or less, 1 second or less, 0.5 seconds or less, 0.1 seconds or less, $5 \times 10^{-2}$ seconds or less, $1 \times 10^{-2}$ seconds or less, $5 \times 10^{-3}$ seconds or less, $1 \times 10^{-3}$ seconds or less, or $5 \times 10^{-4}$ seconds or less). The amount of time in which the ablated portion of the two-dimensional atomic material is ablated can range from any of the minimum values described above to any of the maximum values described above. For example, the ablated portion of the two-dimensional atomic material can be ablated in an amount of time of from $10^{-4}$ seconds to 10 seconds (e.g., from $1 \times 10^{-4}$ seconds to $5 \times 10^{-2}$ seconds, from $5 \times 10^{-2}$ seconds to 10 seconds, from $1 \times 10^{-4}$ seconds to $1 \times 10^{-3}$ seconds, from $1 \times 10^{-3}$ seconds to $1 \times 10^{-2}$ seconds, from $1 \times 10^{-2}$ seconds to 0.1 seconds, from 0.1 seconds to 1 second, from 1 second to 10 seconds, or from $5 \times 10^{-4}$ seconds to 5 seconds). The time in which the ablated portion of the two-dimensional atomic material is ablated can, for example, depend on a number of factors, such as the power density of the electromagnetic radiation, the composition and properties of the optothermal substrate, the composition of the two-dimensional atomic layer material, the amount of time the first location of the optothermal substrate is illuminated with the electromagnetic radiation, the diameter of the ablation region, or a combination thereof.

The methods can further comprise, for example, illuminating a second location of the optothermal substrate thereby: generating a second ablation region at a location of the two-dimensional atomic layer material proximate to the second location of the optothermal substrate, wherein at least a portion of the second ablation region has a temperature sufficient to ablate at least a second portion of the two-dimensional atomic layer material within the second ablation region; and ablating at least a second portion of the two-dimensional atomic layer material within the second ablation region proximate to the second location of the optothermal substrate. As used herein, "a second location" and "the second location" are meant to include any number of locations in any arrangement on the optothermal substrate. Thus, for example "a second location" includes one or more second locations. In some embodiments, the second location can comprise a plurality of locations. In some embodiments, the second location can comprise a plurality of locations arranged in an ordered array. As used herein, "a second portion" of the two-dimensional atomic layer material, "the second portion" of the two-dimensional atomic layer material, "a second ablated portion" of the two-dimensional atomic layer material, and "the second ablated portion" of the two-dimensional atomic layer material are meant to include any number of portions of the two-dimensional atomic layer material in any arrangement. Thus, for example, "a second portion" includes one or more second portions. In some examples, the second ablated portion of the two-dimensional atomic layer material can comprise a plurality of ablated second portions of the two-dimensional atomic layer material. In some examples, the second ablated portion of the two-dimensional atomic layer material can comprise a plurality of ablated second portions in an ordered array.

In some examples, the optothermal substrate, the light source, the mirror, or a combination thereof can be translocated to illuminate the second location. As used herein translocating refers to any type of movement about any axis (e.g., rotation, translation, etc.) In other words, as used herein, translocation refers to a change in position and/or orientation. In some examples, the translocation of the optothermal substrate, the light source, the mirror, or a combination thereof can be controlled by a computing device, wherein the computing device comprises a processor and a memory operably coupled to the processor, the memory having further computer-executable instructions stored thereon that, when executed by the processor, cause the processor to translocate the optothermal substrate, the light source, the mirror, or a combination thereof, such that the light source is configured to illuminate the optothermal substrate at the second location.

In some examples, the methods can further comprise removing the patterned two-dimensional atomic layer material from the optothermal substrate by etching the optothermal substrate, thereby creating a free-standing patterned two-dimensional atomic layer material. The methods can, for example, further comprise depositing the free-standing patterned two-dimensional atomic layer material onto a substrate, such as a substrate comprising glass, quartz, silicon dioxide, a polymer, or a combination thereof.

Also disclosed herein are patterned two-dimensional atomic layer materials made using any of the methods described herein. For example, the patterned two-dimensional atomic layer material can comprise a two-dimensional atomic layer material with one or more ablated portions forming the pattern. For example, the patterned two-dimensional atomic layer material can comprise a plurality of spaced apart ablated portions, wherein the plurality of spaced apart ablated portions can each be the same or different. In some examples, the patterned two-dimensional atomic layer material can comprise a plurality of spaced apart ablated portions arranged in an array. In some examples, the patterned two-dimensional atomic layer material can comprise a two-dimensional atomic layer material with one or more ablated portions that form a plurality of spaced apart portions of the two-dimensional atomic layer material, wherein the plurality of spaced apart portions of the two-dimensional atomic layer material can each be the same or different and, in some examples, can be arranged in an array.

Also disclosed herein are methods of use of the patterned two-dimensional atomic layer materials made using the methods described herein, for example, using the patterned two-dimensional atomic layer materials for optical devices, electronic devices, optoelectronic devices, or combinations thereof.

Also disclosed herein are systems for performing the methods described herein. Referring now to FIG. 1, the systems 100 can comprise an optothermal substrate 102 in thermal contact with a two-dimensional atomic layer material 104; and a light source 106 configured to illuminate the optothermal substrate 102 at a first location 108 with electromagnetic radiation. In some examples, the system 100 can include a single light source 106. In other examples, more than one light source 106 can be included in the system 100.

In some examples, the systems can further comprise a means for translocating the optothermal substrate 102 and/or the light source 106.

Figure 2:
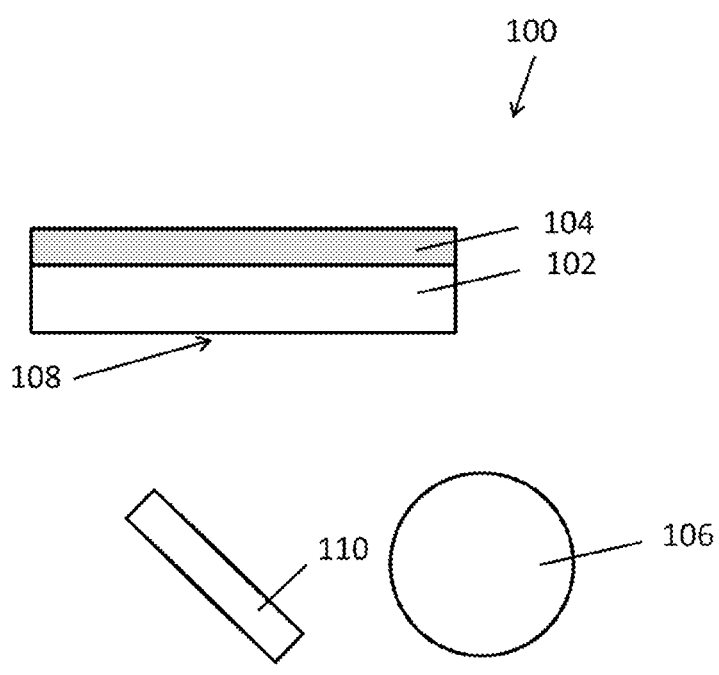
FIG. 2 is a schematic of an exemplary system as disclosed herein for patterning a two-dimensional material.

Referring now to FIG. 2, the systems 100 can, in some examples, further comprise a mirror 110, wherein the system 100 is aligned such that the light source 106 is configured to illuminate the mirror 110 and the mirror 110 is configured to reflect the electromagnetic radiation from the light source 106 to illuminate the first location 108 of the optothermal substrate 102. In some examples, the system 100 can further comprise a means for translocating the mirror 110. In some examples, the mirror 110 comprises a plurality of mirrors (e.g., a digital micromirror device).

Figure 3:
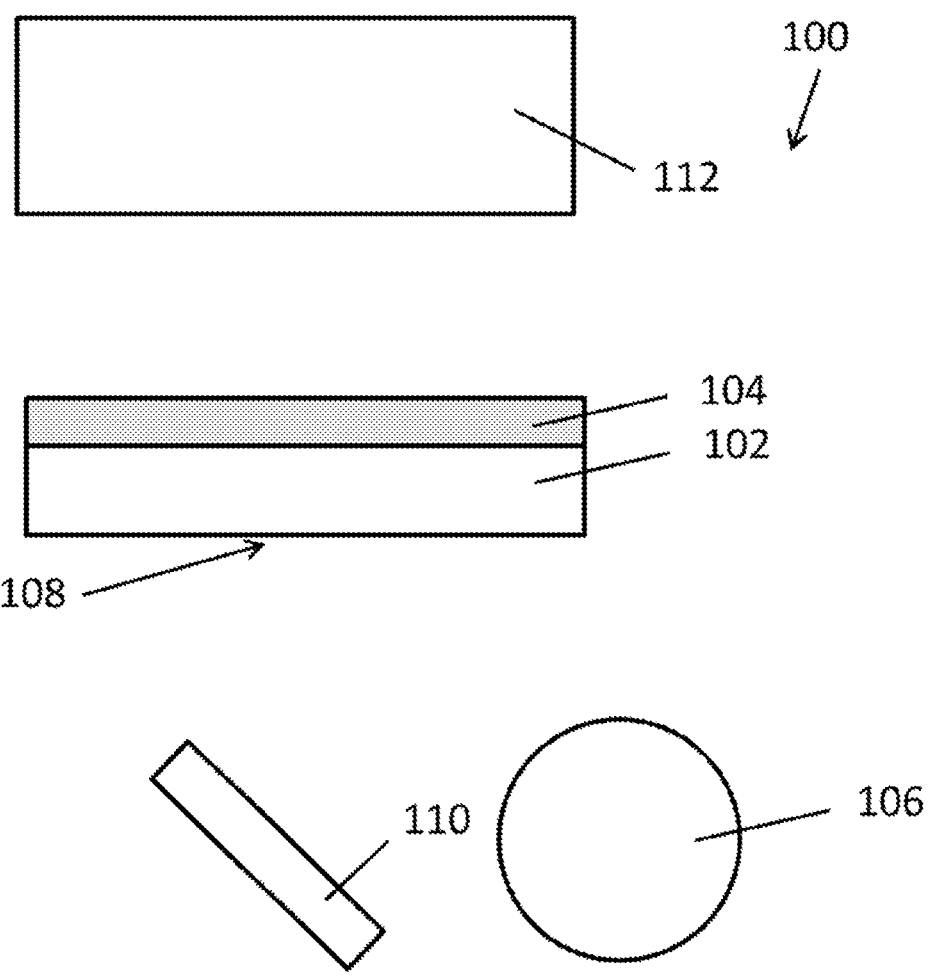
FIG. 3 is a schematic of an exemplary system as disclosed herein for patterning a two-dimensional material.

Referring now to FIG. 3, the systems 100 can, in some examples, further comprise an instrument 112 configured to capture an electromagnetic signal from the optothermal substrate 102 and/or the two-dimensional atomic layer material 104.

In some examples, the system 100 can further comprise a lens 114. The lens can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, or a gradient index lens. In some examples, the system 100 can include a single lens 114. In other examples, more than one lens 114 can be included in the system 100.

Figure 4:
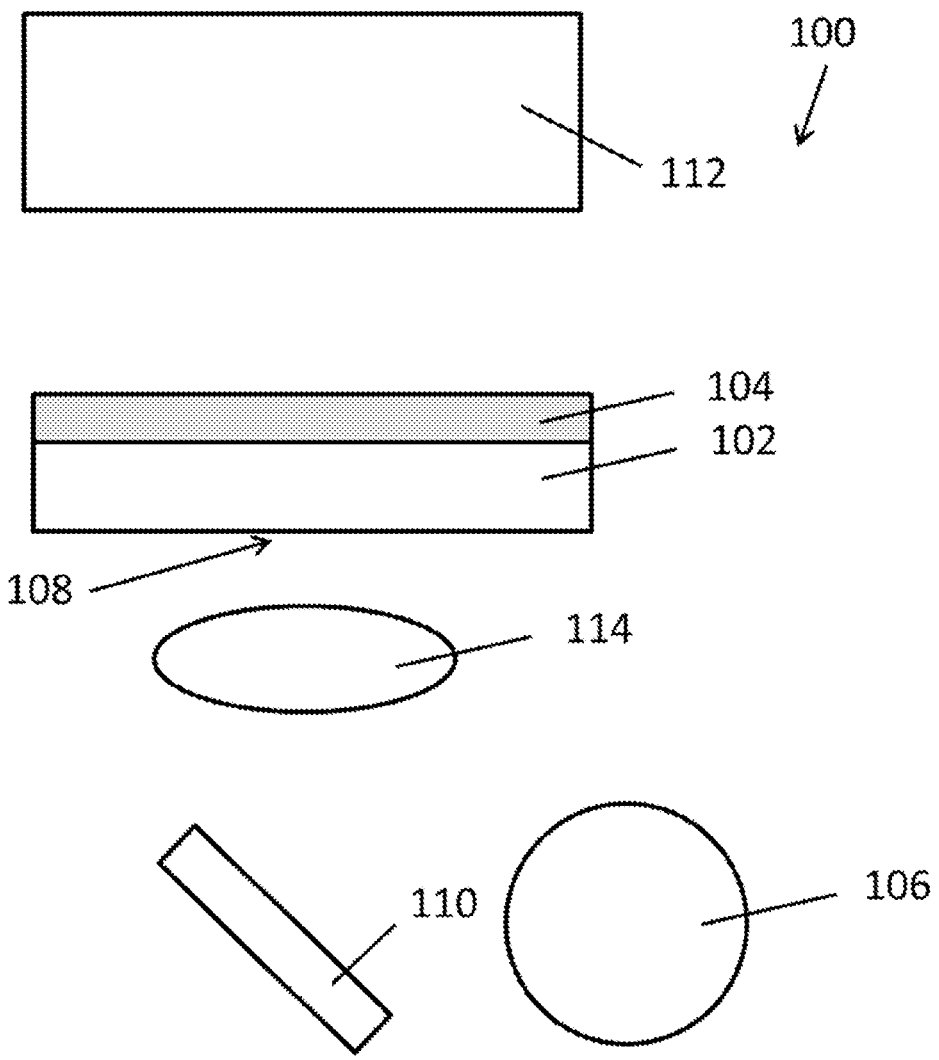
FIG. 4 is a schematic of an exemplary system as disclosed herein for patterning a two-dimensional material.

Referring now to FIG. 4, in some examples, the system 100 can be configured such that the light source 106 is below the lens 114 and the optothermal substrate 102 is above the lens 114.

Figure 5:
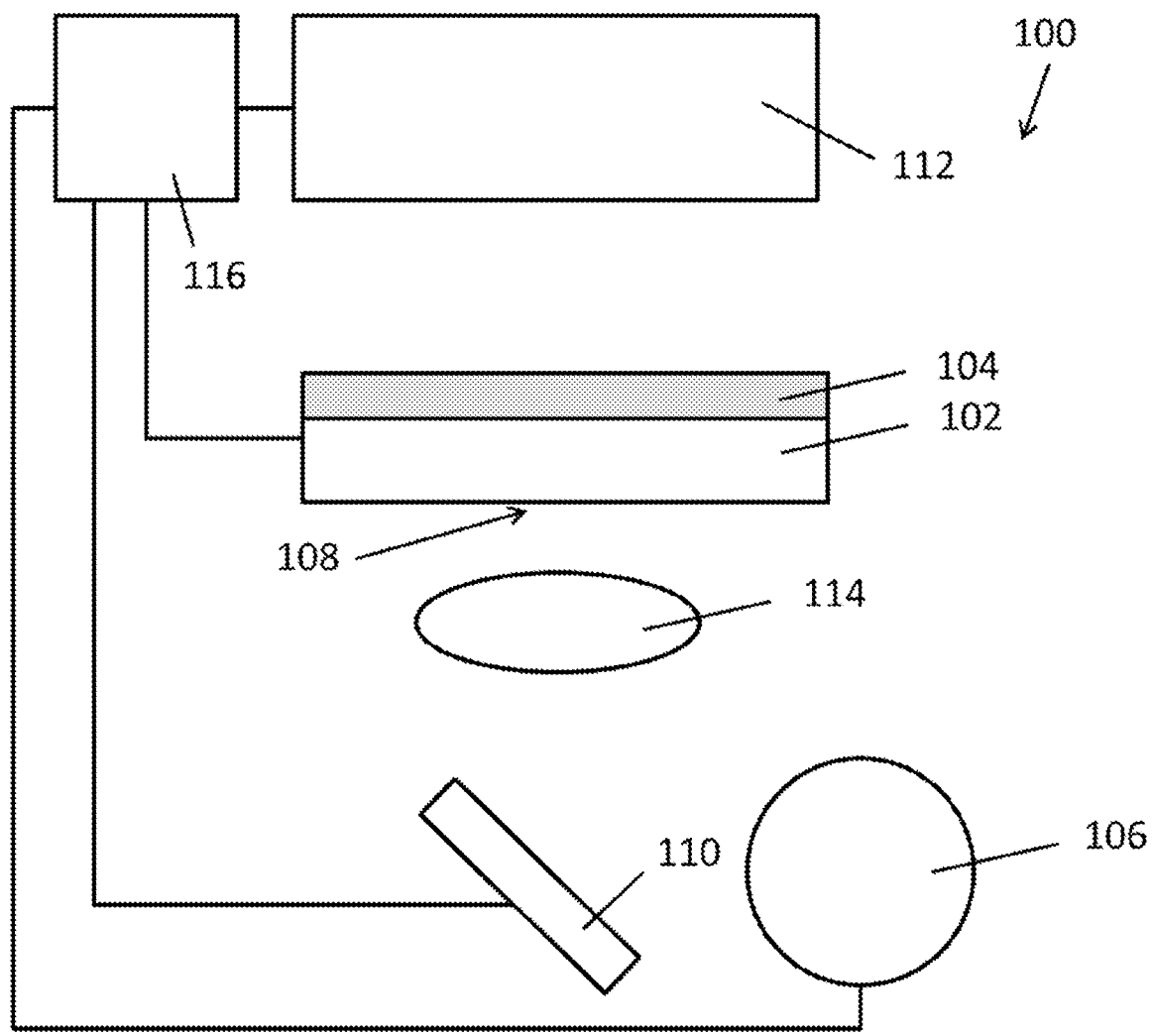
FIG. 5 is a schematic of an exemplary system as disclosed herein for patterning a two-dimensional material.

In some examples, the systems 100 can further comprise a computing device 116, configured to: receive and process electromagnetic signals from the instrument 112; send control signals to the means for translocating the optothermal substrate 102, the light source 106, the mirror 110, or a combination thereof; or a combination thereof, for example as shown in FIG. 5.

Figure 6:
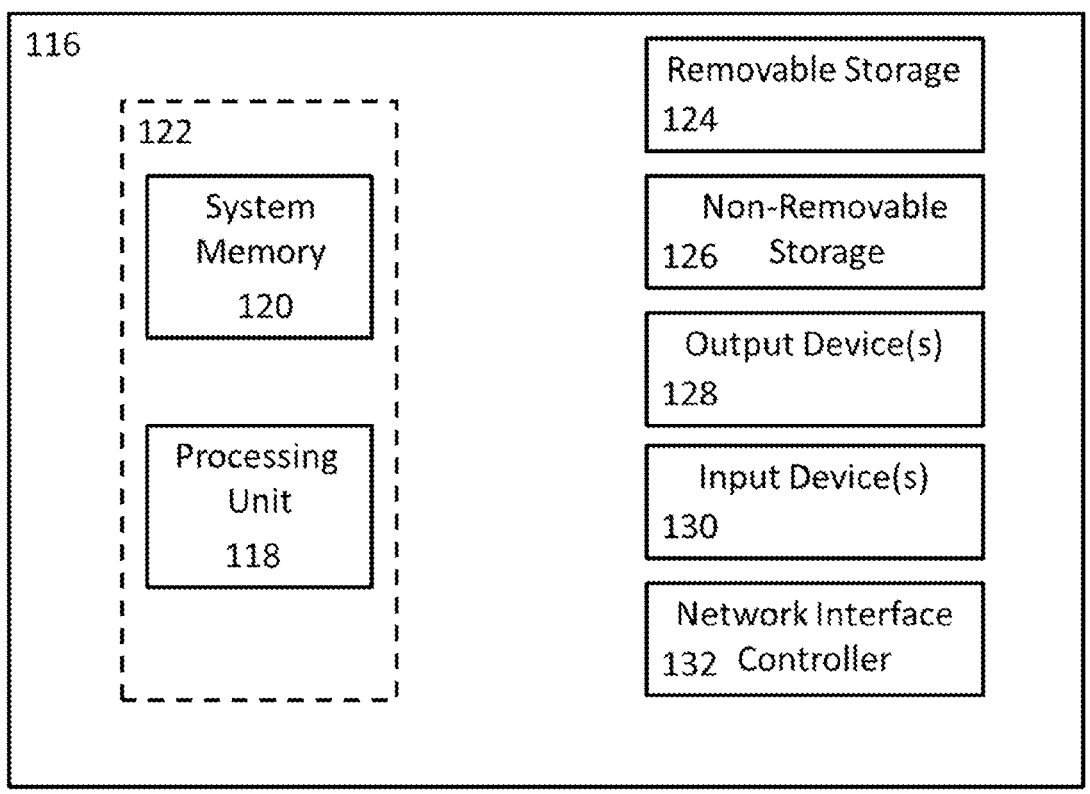
FIG. 6 is a schematic of an exemplary computing device.

FIG. 6 illustrates an example computing device 116 upon which examples disclosed herein may be implemented. The computing device 116 can include a bus or other communication mechanism for communicating information among various components of the computing device 116. In its most basic configuration, computing device 116 typically includes at least one processing unit 118 (a processor) and system memory 120. Depending on the exact configuration and type of computing device, system memory 120 may be volatile (such as random access memory (RAM)), non-volatile (such as read-only memory (ROM), flash memory, etc.), or some combination of the two. This most basic configuration is illustrated in FIG. 6 by a dashed line 122. The processing unit 118 may be a standard programmable processor that performs arithmetic and logic operations necessary for operation of the computing device 116.

The computing device 116 can have additional features/functionality. For example, computing device 116 may include additional storage such as removable storage 124 and non-removable storage 126 including, but not limited to, magnetic or optical disks or tapes. The computing device 116 can also contain network connection(s) 132 that allow the device to communicate with other devices. The computing device 116 can also have input device(s) 130 such as a keyboard, mouse, touch screen, antenna or other systems configured to communicate with the camera in the system described above, etc. Output device(s) 128 such as a display, speakers, printer, etc. may also be included. The additional devices can be connected to the bus in order to facilitate communication of data among the components of the computing device 116.

The processing unit 118 can be configured to execute program code encoded in tangible, computer-readable media. Computer-readable media refers to any media that is capable of providing data that causes the computing device 116 (i.e., a machine) to operate in a particular fashion. Various computer-readable media can be utilized to provide instructions to the processing unit 118 for execution. Common forms of computer-readable media include, for example, magnetic media, optical media, physical media, memory chips or cartridges, a carrier wave, or any other medium from which a computer can read. Example computer-readable media can include, but is not limited to, volatile media, non-volatile media and transmission media. Volatile and non-volatile media can be implemented in any method or technology for storage of information such as computer readable instructions, data structures, program modules or other data and common forms are discussed in detail below. Transmission media can include coaxial cables, copper wires and/or fiber optic cables, as well as acoustic or light waves, such as those generated during radio-wave and infra-red data communication. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 118 can execute program code stored in the system memory 120. For example, the bus can carry data to the system memory 120, from which the processing unit 118 receives and executes instructions. The data received by the system memory 120 can optionally be stored on the removable storage 124 or the non-removable storage 126 before or after execution by the processing unit 118.

The computing device 116 typically includes a variety of computer-readable media. Computer-readable media can be any available media that can be accessed by computing device 116 and includes both volatile and non-volatile media, removable and non-removable media. Computer storage media include volatile and non-volatile, and removable and non-removable media implemented in any method or technology for storage of information such as computer readable instructions, data structures, program modules or other data. System memory 120, removable storage 124, and non-removable storage 126 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 116. Any such computer storage media can be part of computing device 116.

It should be understood that the various techniques described herein can be implemented in connection with hardware or software or, where appropriate, with a combination thereof. Thus, the methods, systems, and associated signal processing of the presently disclosed subject matter, or certain aspects or portions thereof, can take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs can implement or utilize the processes described in connection with the presently disclosed subject matter, e.g., through the use of an application programming interface (API), reusable controls, or the like. Such programs can be implemented in a high level procedural or object-oriented programming language to communicate with a computer system. However, the program(s) can be implemented in assembly or machine language, if desired. In any case, the language can be a compiled or interpreted language and it may be combined with hardware implementations.

In certain examples, the system memory 120 comprises computer-executable instructions stored thereon that, when executed by the processor 118, cause the processor 118 to receive an electromagnetic signal from the instrument 112; process the electromagnetic signal to obtain a characteristic of the optothermal substrate 102 and/or the two-dimensional atomic layer material 104; and output the characteristic of the optothermal substrate 102 and/or the two-dimensional atomic layer material 104.

The analysis of signals captured by the instrument can be carried out in whole or in part on one or more computing device. For example, the system may comprise one or more additional computing device.

The instrument can comprise, for example, a camera, an optical microscope, an electron microscope, a spectrometer, or combinations thereof. Examples of spectrometers include, but are not limited to, Raman spectrometers, UV-vis absorption spectrometers, IR absorption spectrometers, fluorescence spectrometers, and combinations thereof.

In some examples, the electromagnetic signal received by the processor from the instrument can comprise an image, a spectrum (e.g., Raman, UV-vis, IR, fluorescence), a micrograph, or combinations thereof. The characteristic of the optothermal substrate and/or the two-dimensional atomic layer material can comprise, for example, the presence, location, size, shape, and/or quantity of the ablated portion(s) of the two-dimensional atomic layer material; the presence, composition, and/or quantity of the two-dimensional atomic layer material disposed on the optothermal substrate; the presence, location, composition, size, shape, and/or quantity of plasmonic particles comprising the optothermal substrate; the thickness of the metal film comprising the optothermal substrate; or combinations thereof.

In certain examples, the system memory 120 comprises computer-executable instructions stored thereon that, when executed by the processor 118, cause the processor 118 to send control signals to the means for translocating the optothermal substrate 102, the light source 106, the mirror 110, or a combination thereof to thereby: translocate the optothermal substrate 102, the light source 106, the mirror 110, or a combination thereof, such that the light source 106 is configured to illuminate the optothermal substrate 102 at a second location, thereby: generating a second ablation region at a location of the two-dimensional atomic layer material 104 proximate to the second location of the optothermal substrate 102, wherein at least a portion of the second ablation region has a temperature sufficient to ablate at least a portion of the two-dimensional atomic layer material 104 within the second ablation region; and ablating at least a portion of the two-dimensional atomic layer material 104 within the second ablation region proximate to the second location of the optothermal substrate 102.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Atomically-thin two-dimensional (2D) materials exhibit many unique and extraordinary properties beyond their bulk parent materials, such as excellent mechanical flexibility, high thermal conductivity, as well as a tunable electronic band-gap (Butler et al. *ACS Nano* 2013, 7, 2898; Kim et al. *Ann. Rev. Mater. Res.* 2015, 45, 63; Lee et al. *Science* 2008, 321, 385; Balandin, *Nat. Mater.* 2011, 10, 569; Das et al. *Nano Lett.* 2014, 14, 2861; Xia et al. *Nat. Photonics* 2014, 8, 899). The increasing material diversity with emerging new electric and optical properties has led to the development of 2D electronic and photoelectronic devices, including field-effect transistors, photon detectors, light emitting diodes, and solar cells (Fang et al. *Nano Lett.* 2012, 12, 3788; Koppens et al. *Nat. Nanotechnol.* 2014, 9, 780; Withers et al. *Nat. Mater.* 2015, 14, 301; Tsai et al. *ACS Nano* 2014, 8, 8317; Huang et al. *ACS Nano* 2016, 10, 7493). The precise control of size and shape of 2D materials can be a critical fabrication step for device applications (Feng et al. *Nanoscale* 2012, 4, 4883). Specifically, the geometry control of 2D materials at wavelength and sub-wavelength scale can significantly tune their optical responses (Ju et al. *Nat. Nanotechnol.* 2011, 6, 630; Rodrigo et al. *Science* 2015, 349, 165; Li et al. *Sci. Rep.* 2015, 5, 12423; Ma et al. *ACS Photonics* 2017, 4, 1770). Traditional top-down patterning techniques, including photolithography (Shi et al. *Appl. Phys. Lett.* 2013, 102, 113102), electron beam lithography (Ju et al. *Nat. Nanotechnol.* 2011, 6, 630; Katagiri et al. *Nano Lett.* 2016, 16, 3788), and ion beam lithography (Lemme et al. *ACS Nano* 2009, 3, 2674; Fox et al. *Nano Lett.* 2015, 15, 5307), have been extensively employed to fabricate diverse 2D patterns. However, they typically require complex instruments with high-cost and multiple-step processing.

Laser processing of low-dimensional materials is a remotely controlled, one-step, maskless, and low-cost fabrication technique which provides an alternative approach (Booth, *Thin Solid Films* 2004, 453-454, 450). The direct or indirect light-matter interactions at the laser spots, e.g., laser-induced thermal effect (Plech et al. *Phys. Rev. B* 2004, 70, 195423), radiation force (Ashkin, *Science* 1980, 210, 1081), laser-induced phase transition (Cho et al. *Science* 2015, 349, 625; Mine et al. 2018, arXiv:1807.04914), or photon-assisted chemical reaction (Tsuchiya et al. *Prog. Mater. Sci.* 2009, 54, 981), open new ways to control or modify the composition, structure, and geometry of materials (He et al. *J. Appl. Phys.* 2004, 96, 4547; Mezour et al. *Anal. Chem.* 2011, 83, 2378; Collet et al. *Science* 2003, 300, 612). In the past few years, laser processing of 2D materials using femtosecond laser has also been achieved (Yoo et al. *MRS Bull.* 2016, 41, 1002; Sahin et al. *Appl. Phys. Lett.* 2014, 104, 053118; Paradisanos et al. *Appl. Phys. Lett.* 2014, 105, 041108; Stöhr et al. *ACS Nano* 2011, 5, 5141; Castellanos-Gomez et al. *Nano Lett.* 2012, 12, 3187; Sahin et al. *Appl. Phys. A* 2014, 116, 555). However, high optical power is usually required, and the fabrication of sub-micron patterns is still challenging.

Light-driven coherent oscillation of surface electrons on metal nanoparticles, i.e., the excitation of surface plasmons, can dramatically amplify optical signals (Zayats et al. *Phys. Rep.* 2005, 408, 131). Particularly, the plasmon-enhanced electric field at localized nanoscale regions improves the light-matter interaction and facilitates the development of novel optical techniques in material processing. For example, the confinement of light with a plasmonic mask can overcome the diffraction limit and lead to the development of plasmonic nanolithography (Srituravanich et al. *Nano Lett.* 2004, 4, 1085; Pan et al. *Sci. Rep.* 2011, 1, 175; Luo et al. *Appl. Phys. Lett.* 2004, 84, 4780; Gao et al. *Appl. Phys. Lett.* 2015, 106, 093110).

Herein, taking advantage of the plasmon-enhanced light absorption in metal nanoparticles and the localized optical heating effect (Lin et al. *Nano Lett.* 2016, 16, 701; Lin et al. *Nat. Photonics* 2018, 12, 195), all-optical lithographic technique—opto-thermoplasmonic nanolithography (OTNL)—for low-power, on-demand, high-throughput, versatile, maskless, and programmable patterning of 2D materials using a continuous-wave (CW) laser is described. Low-power (~5 mW/$\mu$m$^2$) and high-resolution patterning of both graphene and $MoS_2$ monolayers is demonstrated through exploiting thermal oxidation and sublimation in the light-directed temperature field created by the highly localized thermoplasmonic hot spots can lead to direct etching of the atomic layers. Density functional theory (DFT) simulations reveal that Au nanoparticles can reduce the formation energy (~0.6 eV) of C monovacancies through bonding between under-coordinated C and Au, leading to Au-catalyzed graphene oxidation and a reduction of the required laser operation power. Programmable patterning of 2D materials into complex and large-scale nanostructures is further demonstrated. Through steering the laser beam, arbitrary and complex 2D patterns with both high throughput and high resolution are demonstrated. With its low-power, high-resolution, and versatile patterning capability, OTNL offers the possibility to scale up the fabrication of nanostructured 2D materials for many applications in photonic and electronic devices.

Thermoplasmonic substrate. The thermoplasmonic substrate was fabricated by a two-step process. First, a 4.5 nm Au film was deposited on a glass/Si substrate with thermal deposition (Denton thermal evaporator) at a base pressure below $1 \times 10^{-5}$ Torr. Then, the Au film was thermally annealed at 550° C. for 2 h.

Growth and transfer of $MoS_2$. The atomic-layer $MoS_2$ was grown by chemical vapor deposition using a Thermo Scientific Lindberg/Blue M Tube Furnace. $MoO_3$ powder (15 mg) and sulfur powder (1 g) were loaded in a quartz tube and heated independently. After 4 purging cycles, the tube was filled with UHP $N_2$ to 760 Torr at 10 sccm. The furnace was heated to 850° C. at a rate of 50° C./min for 5-minute growth and then cooled down to room temperature. Poly-methyl methacrylate (PMMA, Microchem 950 A4) was coated to support monolayer $MoS_2$ on $SiO_2$/Si substrate. The $SiO_2$ layer was then etched in buffered oxide etch (Microchem, BOE 7:1) solution, and the PMMA-supported $MoS_2$ film was transferred on to the thermoplasmonic substrate. Finally, the PMMA layer was dissolved by soaking the sample in acetone.

Growth and transfer of graphene. A quartz tube loaded with a copper (Cu) foil (Alfa Aesar, 25 $\mu$m thick, 99.99999% pure) was purged and back filled with hydrogen gas ($H_2$). The tube was then heated to 1030° C. with $H_2$ pressure of 40 mTorr. After 15 minutes, methane gas ($CH_4$) was introduced at 5 sccm and graphene was grown on the Cu foil for 10 min, after which the furnace was cooled down to room temperature. PMMA film was coated on one side of the graphene/Cu substrate while the other side of was removed by oxygen plasma etching. Then, an aqueous ammonium peroxydisulfate solution (Transene, APS-100) was used to etch the Cu foils. The PMMA-supported graphene was washed with deionized water and transferred to the thermoplasmonic substrate, followed by removal of the PMMA layer by acetone.

Growth and transfer of $WSe_2$. $WSe_2$ was grown by CVD as described in previous literature (Zhang et al. *Nano Lett.* 2018, 18, 1049) and transferred to thermoplasmonic substrate by wet transfer, as described above for $MoS_2$ and graphene.

OTNL procedure. The OTNL process was performed by a combination of stage translation and shutter activation/deactivation or using a spatial light modulator (SLM). A Prior ProScan Scientific stage with an x-y resolution of 14 nm and a motorized flipper (Thorlabs MFF102) that acted as a shutter were used. For complex patterns, the stage and shutter integrated with the optical path were synchronously controlled with custom-written LabVIEW code. The stage moved along the predetermined (x, y) coordinates with an on/off status of the shutter for each coordinate. Multiple laser spots were achieved using an SLM (Boulder Nonlinear Systems, model P512), two relay lenses (both of focal length 20 cm), and a 50× long working distance objective (Mitutoyo, NA: 0.55).

Sample characterizations. The high-resolution SEM image of the thermoplasmonic substrate was taken using the Hitachi S5500 SEM/STEM system. The Raman spectroscopy and photoluminescence of $MoS_2$ were performed on a Renishaw in-Via system using a 532 nm wavelength laser source. Raman spectra of graphene were measured with the same system using a 442 nm laser source. The absorption spectrum of the thermoplasmonic substrate was measured by an inverted microscope (Ti-E, Nikon) with a spectroscope (Andor), an EMCCD (Andor) and a halogen white light source (12V, 100 W).

COMSOL simulations. Temperature distribution around the laser spot at the surface of thermoplasmonic substrate was simulated using the finite element method (COMSOL v5.3). An axisymmetric model consisting of a substrate and air domain was established. The laser heating was modeled as a Gaussian heat source at the substrate-air interface. The diameter of laser beam was 1 μm and the light-to-heat conversion coefficient was 0.35 (based on FIG. 8). The thermal conductivities of air and glass substrate were kept as default while the thermal conductivity of the silicon and $Al_2O_3$ was varied with temperature (Glassbrenner et al. *Phys. Rev.* 1964, 134, A1058; Touloukian, Thermophysical and Electronic Properties Information Analysis Center Lafayette Ind., 1966). In the simulation, a steady state heat transfer equation was solved within a 300 μm×200 μm domain. Room temperature (298 K) was set for all outer boundaries.

DFT calculations. DFT calculations were performed using the Vienna Ab-initio Simulation Package (VASP) (Kresse et al. *Phys. Rev. B* 1993, 47, 558; Kresse et al. *Phys. Rev. B* 1996, 54, 11169) with PAW potential and PAW functional with vdW correction (Kresse et al. *Phys. Rev. B* 1999, 59, 1758; Blöchl, *Phys. Rev. B* 1994, 50, 17953). The Perdew-Burke-Ernzerhosf (PBE) exchange-correlation functional (Perdew et al. *Phys. Rev. Lett.* 1996, 77, 3865) was used to relax the systems. The graphene-Au interface was modeled using a 6×6 supercell of graphene and a 5×5 supercell of Au (111) surface with 3 layers. In this way the lattice mismatch was reduced to <2%. A 3×3×1 Monkhorst-Pack k point mesh was used for the Brillouin zone integration, and a vacuum layer of 15 Å was used to prevent interactions between periodic images. A kinetic energy cutoff of 400 eV was used for the plane-wave expansion, and all atomic positions were fully relaxed until the final force on each atom was less than 0.01 eV/Å. The formation energy of C vacancy was calculated as:

$$E_{f,\,vac}=E(\text{host+one }C\text{ vacancy})-E(\text{host})+E(C) \quad (1)$$

where E (host) is the energy of free standing graphene or graphene on Au substrate. E(C) is the reference energy of a C atom. The E(C) will be cancelled when comparing to the $E_{f,\,vac}$ in different hosts, and thus the relative difference is independent on E(C).

The adsorption energy of an oxygen atom was calculated as:

$$E_{f,\,O}=E(\text{host+}O)-(\text{host})-E(O) \quad (2)$$

where E(O) is the reference energy of an O atom. The E(O) will be cancelled when comparing to the $E_{f,\,O}$ in different hosts, and thus the relative difference is independent on E(O).

Figure 7:
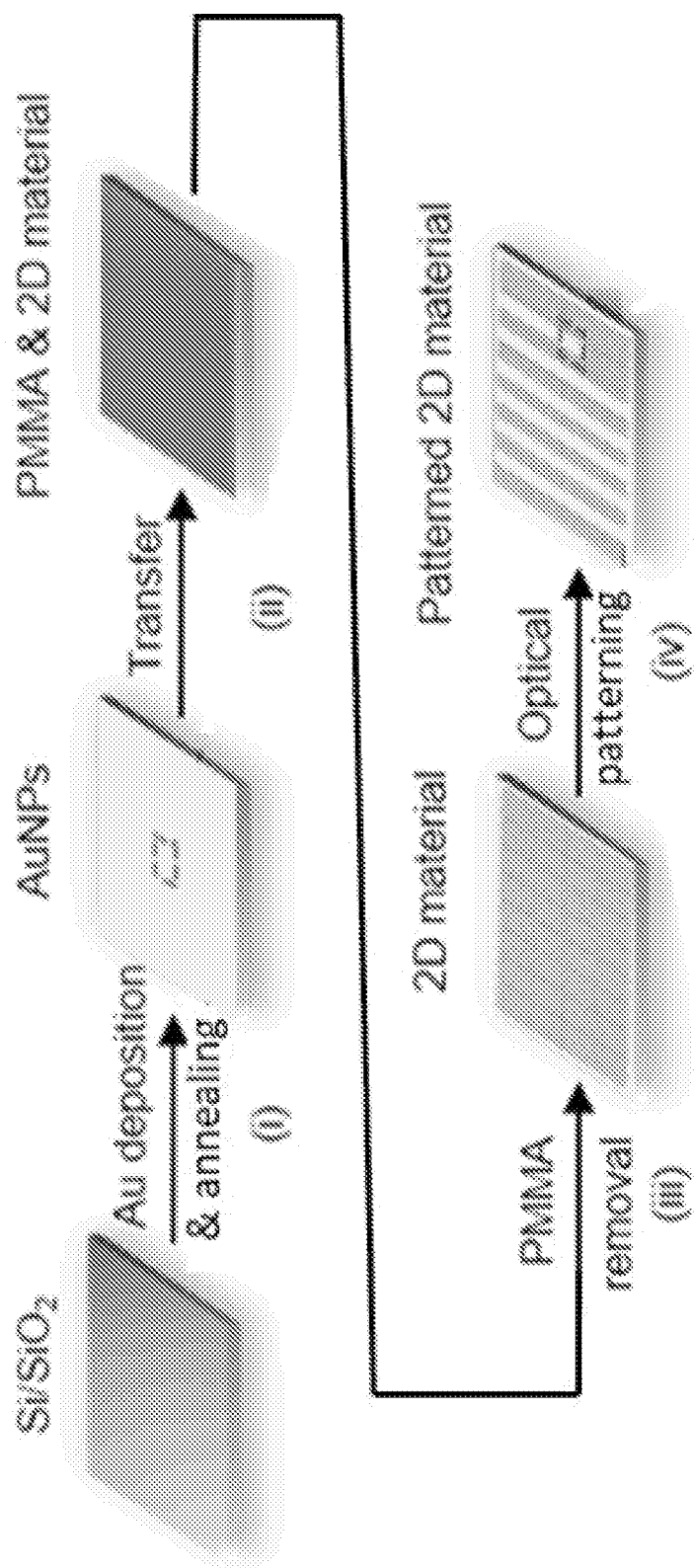
FIG. 7 is schematic flowchart of OTNL process for 2D material patterning, which includes (i) fabrication of thermoplasmonic substrate; (ii) transfer of 2D materials onto the thermoplasmonic substrate; (iii) PMMA removal by acetone; (iv) optical patterning of 2D materials.
Figure 8:
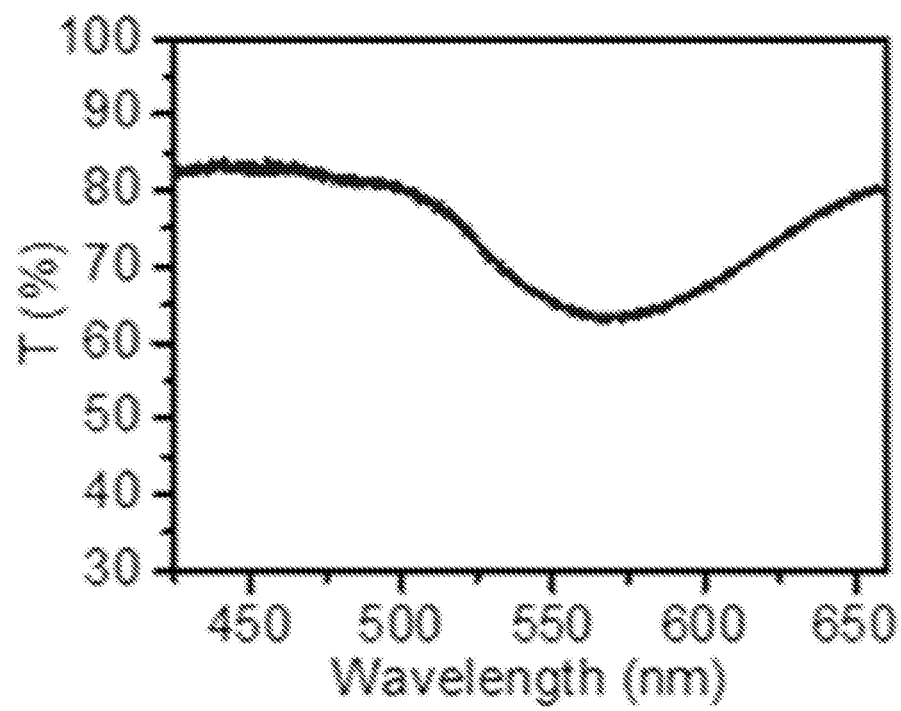
FIG. 8 is the absorption spectrum of the thermoplasmonic substrate.
Figure 9:
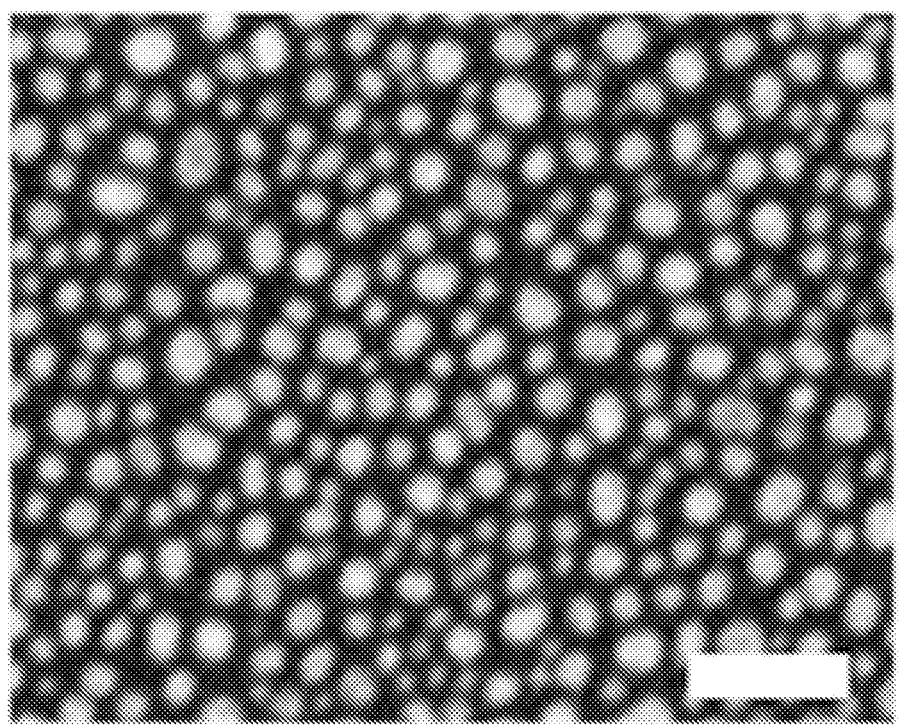
FIG. 9 is a scanning electron micrograph of the thermoplasmonic substrate whose absorption spectrum is shown in FIG. 8. Scale bar: 100 nm.
Figure 10:
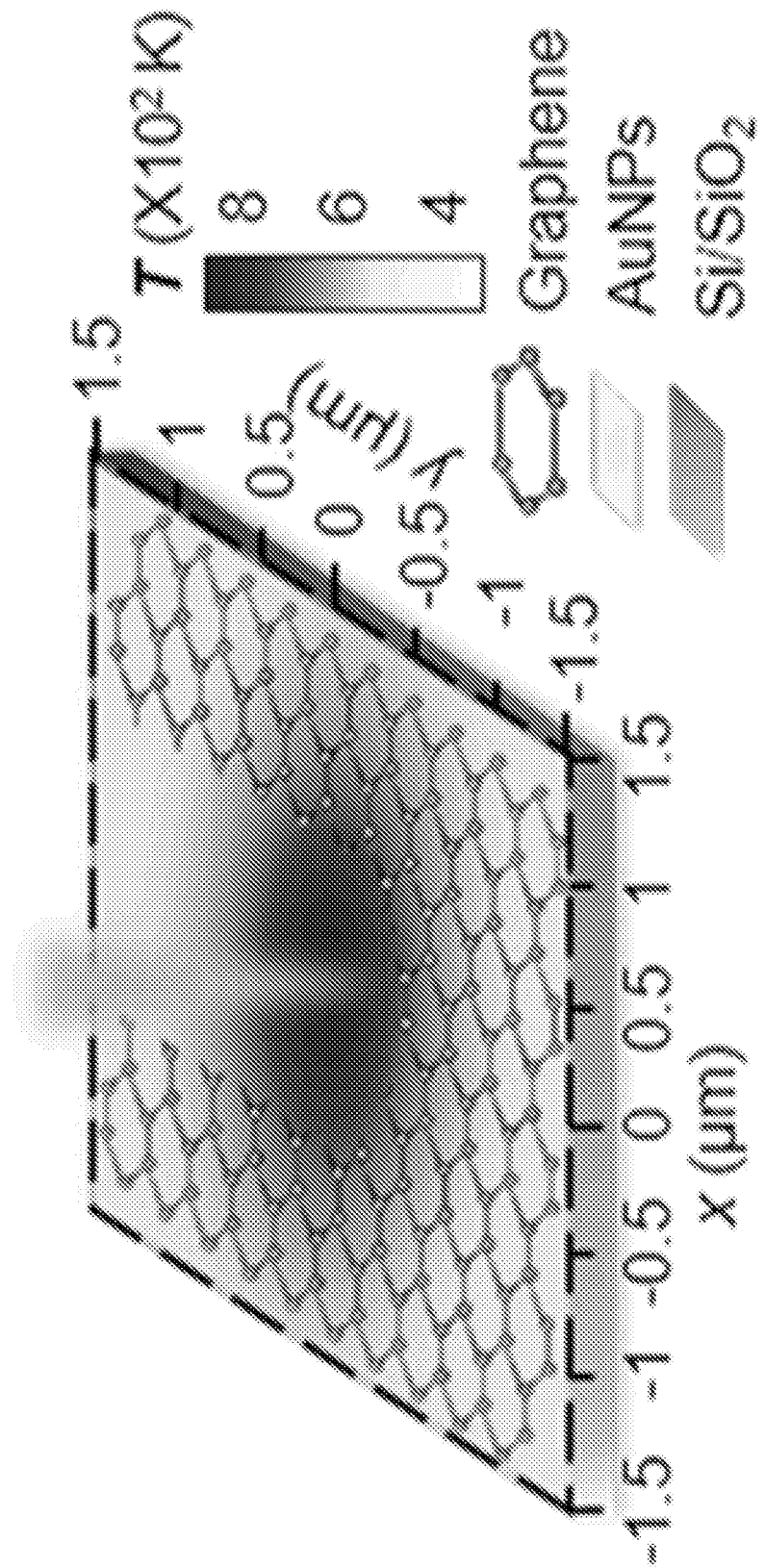
FIG. 10 is an enlarged scheme showing the working area of OTNL. The embedded map shows the simulated temperature distribution of thermoplasmonic substrate around the laser spot. Laser beam size: 1 μm and incident power: 6.4 mW/μm$^2$.
Figure 11:
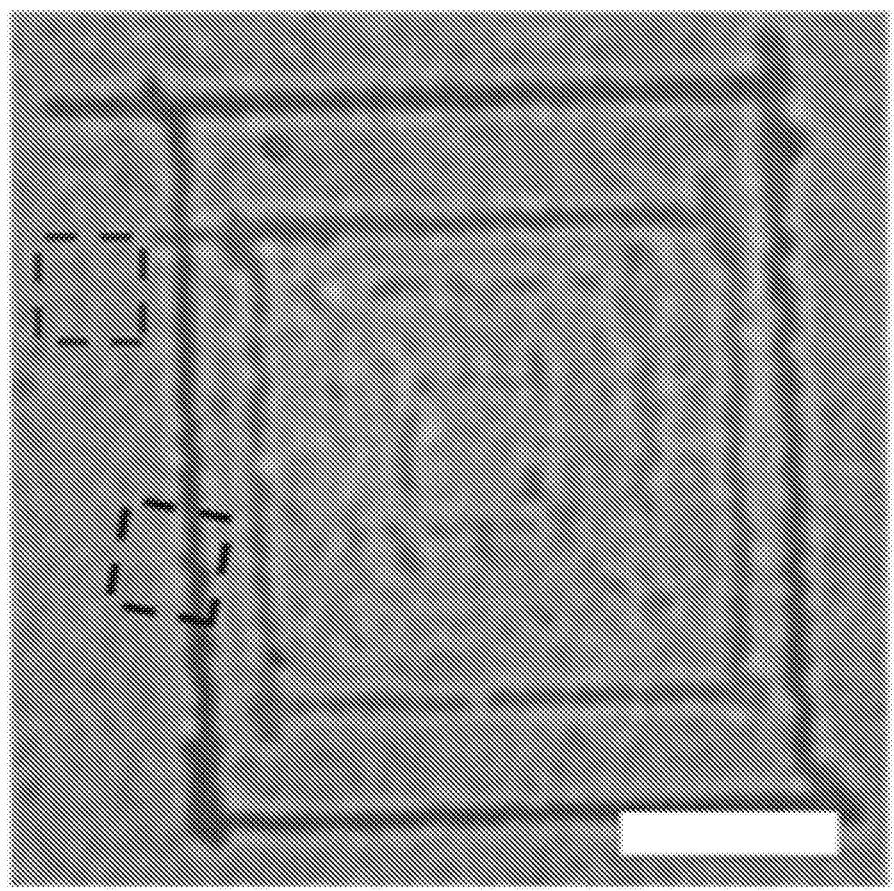
FIG. 11 is an optical image of four squares patterned on graphene. The linewidth is ~1 μm. Scale bar: 10 μm.
Figure 12:
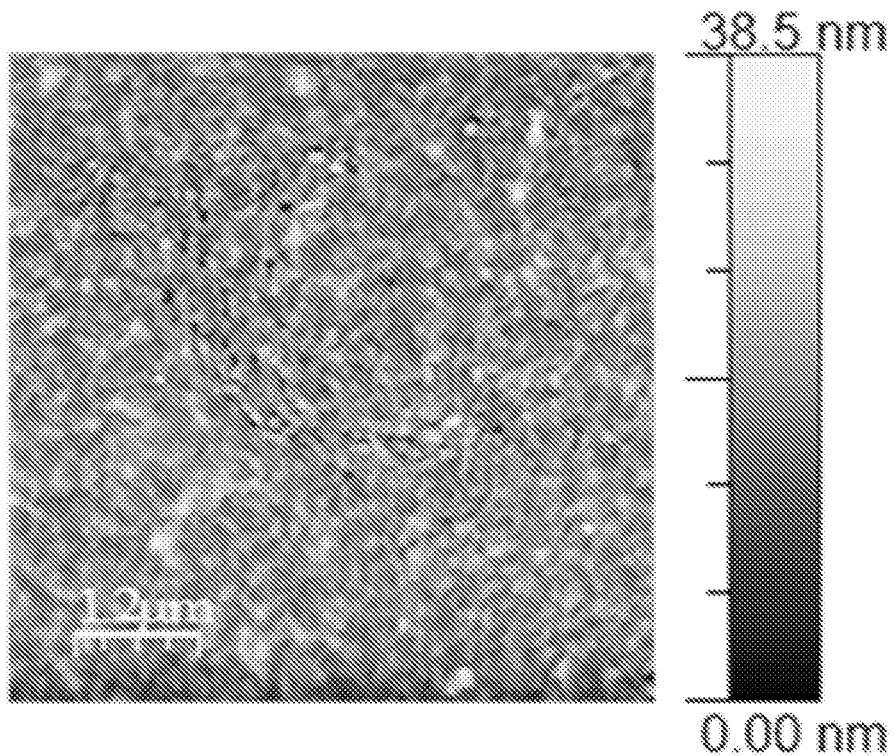
FIG. 12 is an AFM image of the unpatterned area of the sample on graphene indicated by the upper dashed rectangle in FIG. 11.
Figure 13:
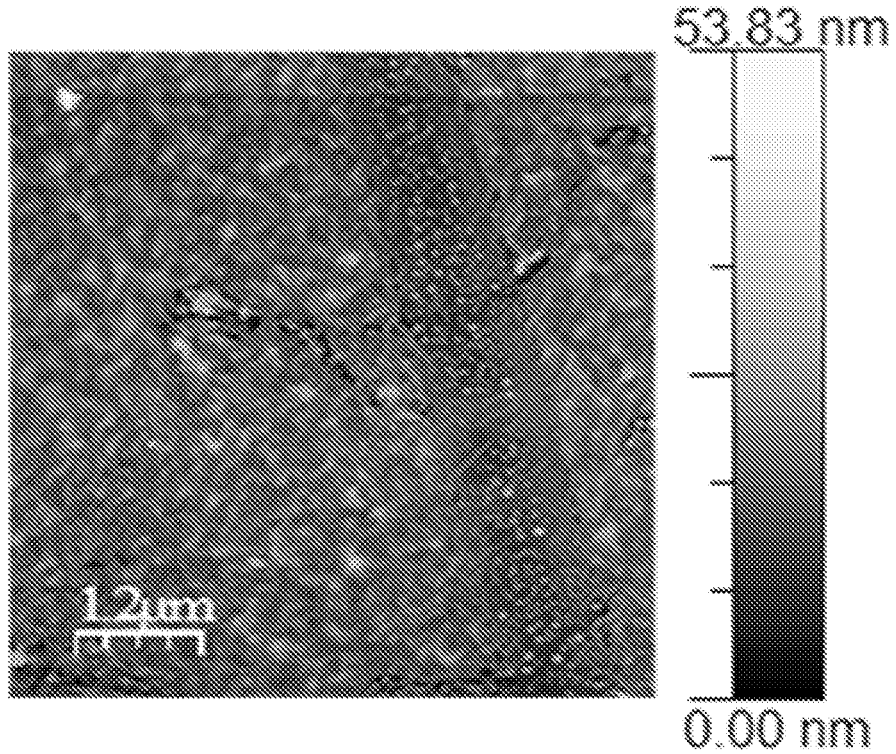
FIG. 13 is an AFM image of a patterned area of the sample on graphene indicated by the lower dashed rectangle in FIG. 11. A clear trench can be observed in FIG. 13.
Figure 14:
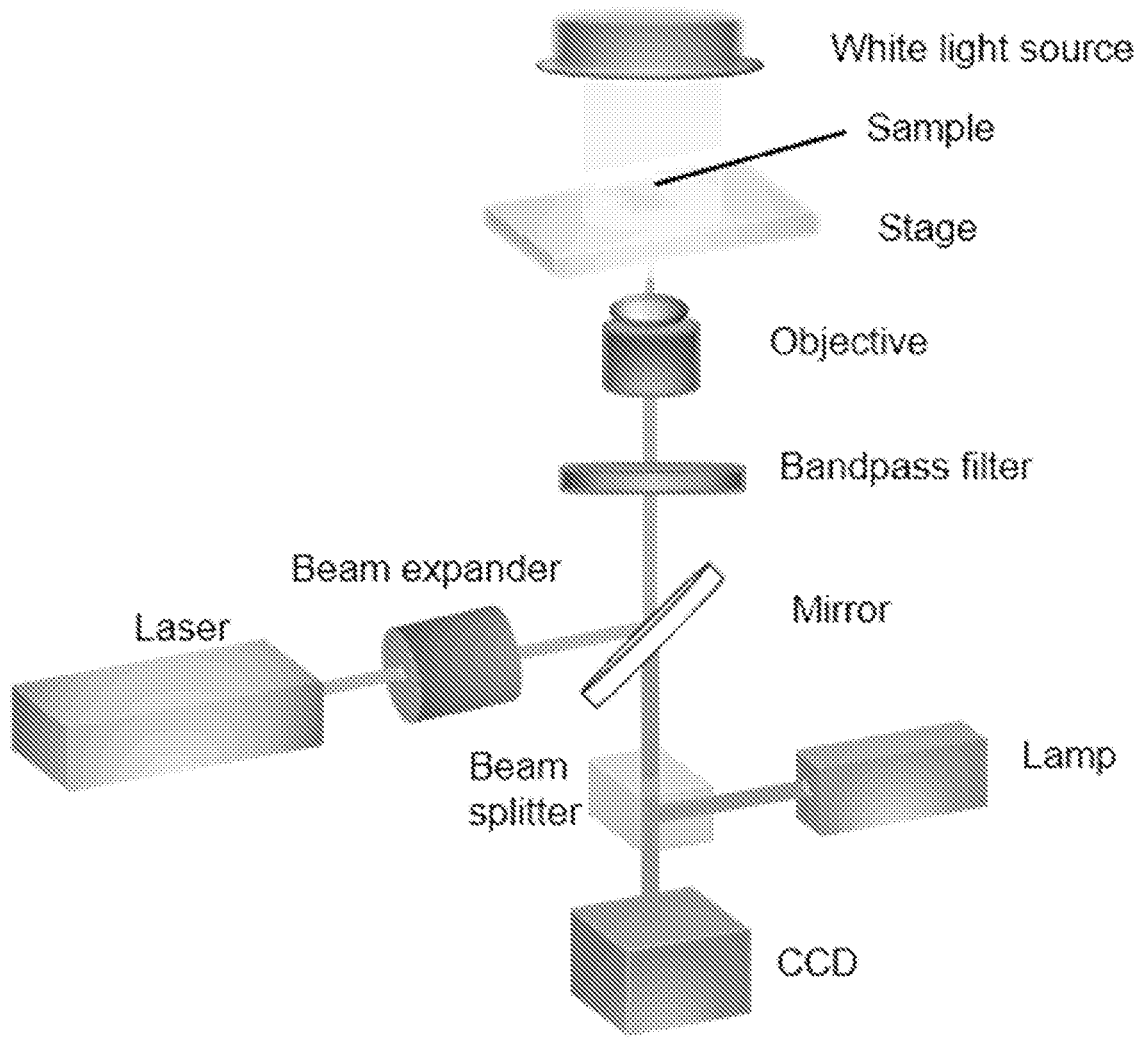
FIG. 14 is a schematic diagram of the optical setup for OTNL.

FIG. 7 shows the whole process of OTNL. A porous Au film comprising high-density and quasi-continuous gold nanoparticles (AuNPs) serves as a thermoplasmonic substrate (FIG. 8 and FIG. 9). Under radiation of a focused 532 nm laser beam, localized surface plasmon resonances are excited on the thermoplasmonic substrate, with both high-efficiency light absorption and light-to-heat conversion. The high-density gold nanoparticles lead to well-confined and localized thermal hot spots during optical heating. As shown in FIG. 10, the simulated in-plane temperature distribution reveals a maximum temperature of 850 K when the thermoplasmonic surface is heated by a laser beam with an optical intensity of 6.4 mW/μm². To achieve coupling between the 2D materials and the thermal hot spots, graphene or $MoS_2$ monolayers were transferred onto the thermoplasmonic substrate (see Methods for the fabrication details). Through steering the laser beam with a spatial light modulator (SLM) or translating the substrate via a motorized stage (FIG. 14), dynamic interaction between the 2D materials and the thermal hot spots for arbitrary optical patterning was achieved (FIG. 11). The patterning of 2D materials was further characterized by atomic force microscope (FIG. 12 and FIG. 13). As shown in FIG. 13, a clear trench can be observed at the laser scanned area, which indicates the graphene was removed after optical patterning.

Figure 15:
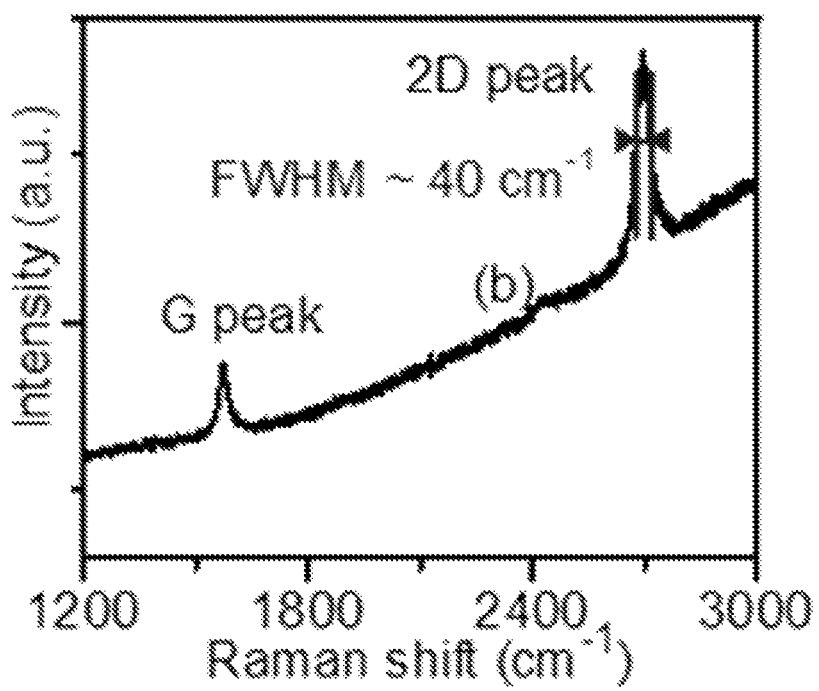
FIG. 15 is the Raman spectrum of before patterning via OTNL.
Figure 16:
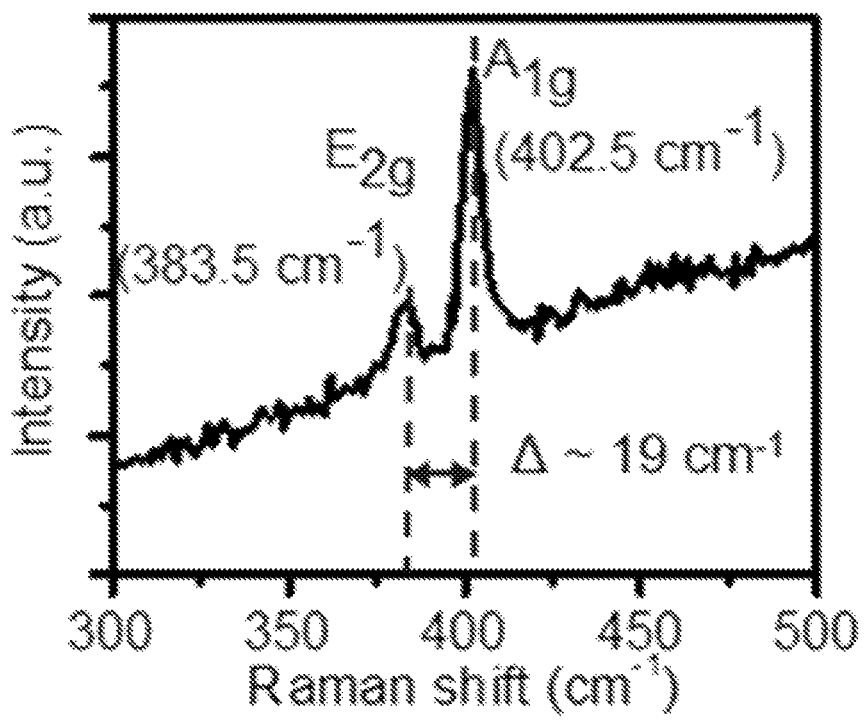
FIG. 16 is the Raman spectrum of MoS$_2$ before patterning via OTNL.
Figure 19:
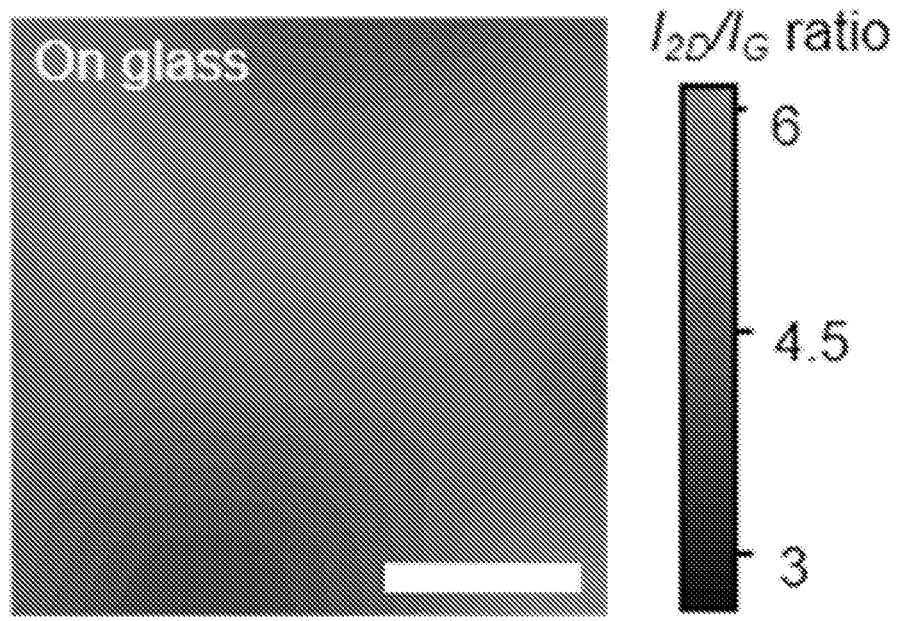
FIG. 19 is a Raman mapping image of $I_{2D}/I_G$ ratio of graphene before being transferred onto a thermoplasmonic substrate. The large $I_{2D}/I_G$ ratios (>4) represent the high quality of monolayer graphene. Scale bar: 2 μm.
Figure 20:
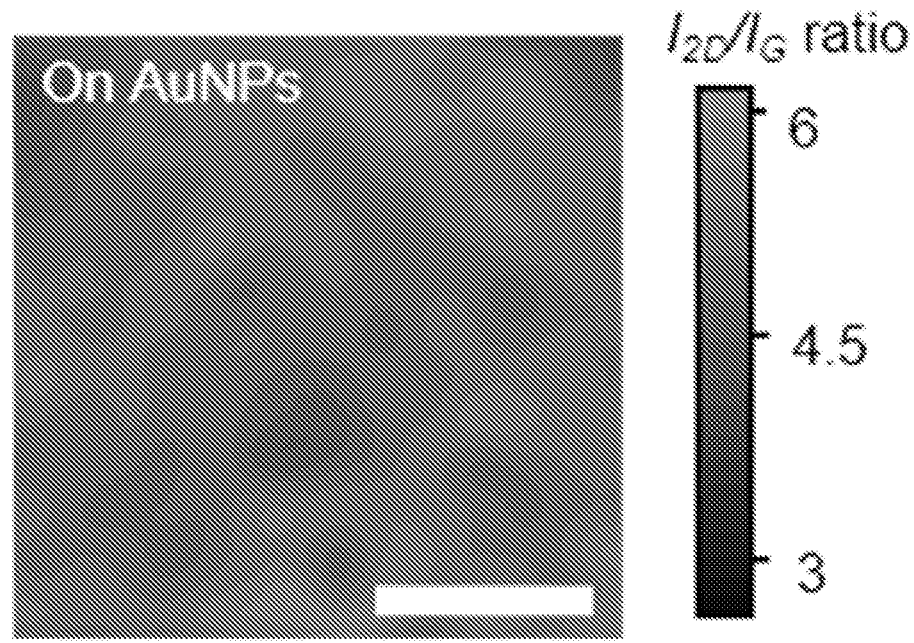
FIG. 20 is Raman mapping image of $I_{2D}/I_G$ ratio of graphene after being transferred onto a thermoplasmonic substrate. The large $I_{2D}/I_G$ ratios (>4) represent the high quality of monolayer graphene. Scale bar: 2 μm.
Figure 21:
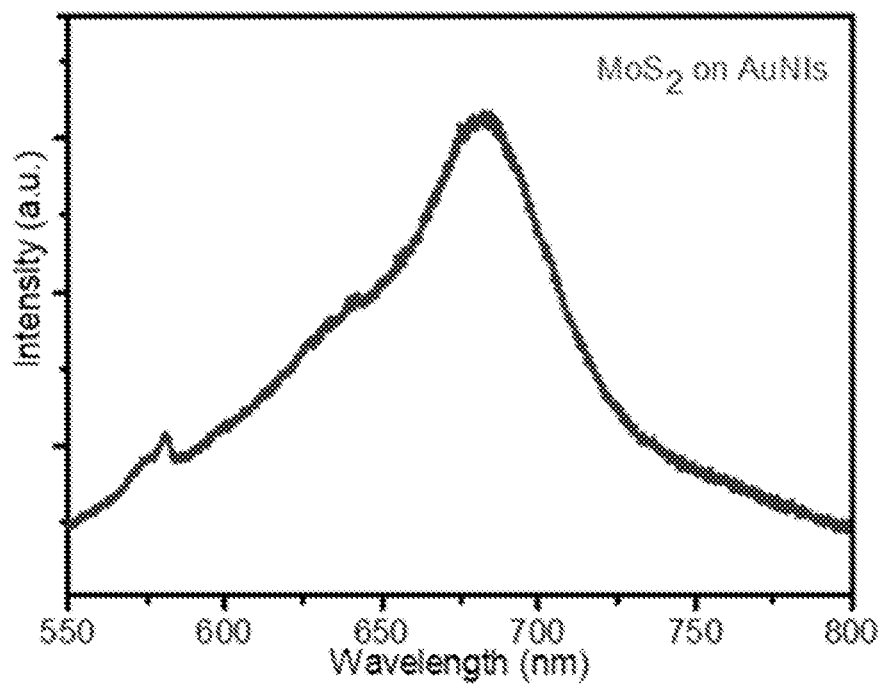
FIG. 21 is the photoluminescence spectrum of MoS$_2$ on AuNIs. The sharp $A_1$ resonance peak at ~675 nm indicates the monolayer MoS$_2$ and the broad peak at ~625 nm are attributed to $B_1$ excitons and gold nanoislands (AuNIs).
Figure 22:
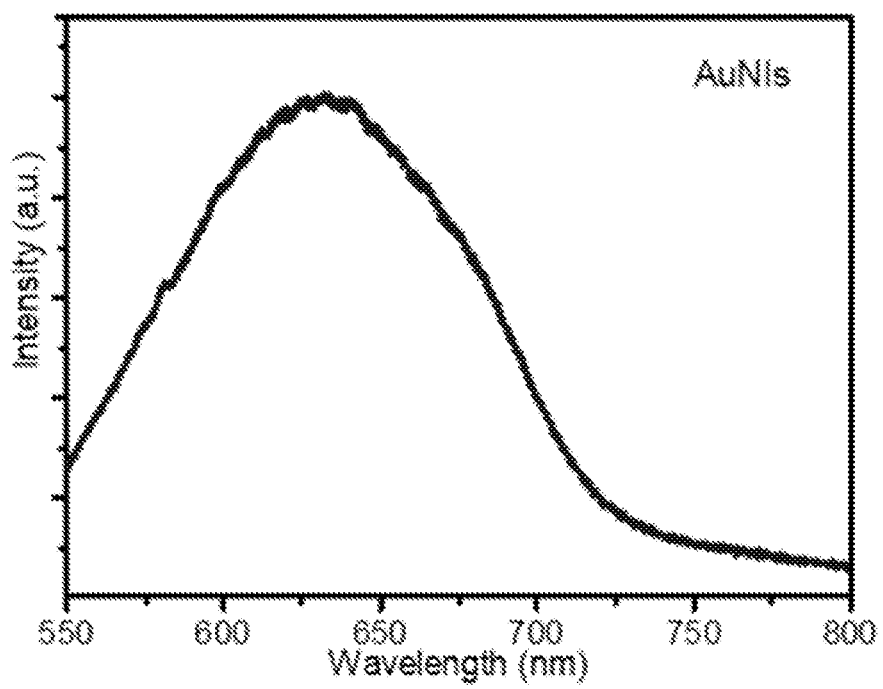
FIG. 22 is the photoluminescence spectrum of bare AuNIs. The broad peak at ~625 nm is attributed to $B_1$ excitons and AuNIs.

FIG. 15 shows the Raman spectrum of graphene before patterning. Both the high $I_{2D}/I_G$ ratio (approximately 5) and the narrow full-width at half-maximum (FWHM) of the 2D peak (~40 cm⁻¹) reveal the high-quality graphene monolayer (FIG. 15) (Sun et al. *Nature* 2010, 468, 549). For $MoS_2$, the distance between the $E_{2g}$ band and the $A_{1g}$ band is ~19 cm⁻¹ (FIG. 16), which is consistent with the value for $MoS_2$ monolayers in previous works (Castellanos-Gomez et al. *Nano Lett.* 2012, 12, 3187). The photoluminescence (PL) spectrum of $MoS_2$ shows an intensive PL peak at 675 nm, which further confirms the existence of $MoS_2$ monolayer (FIG. 21-FIG. 22) (Splendiani et al. *Nano Lett.* 2010, 10, 1271). The Raman mapping images of $I_{2D}/I_G$ ratio on graphene before and after transfer further verify the high crystalline quality of the graphene is maintained after being transferred onto the thermoplasmonic substrate (FIG. 19 and FIG. 20).

Figure 17:
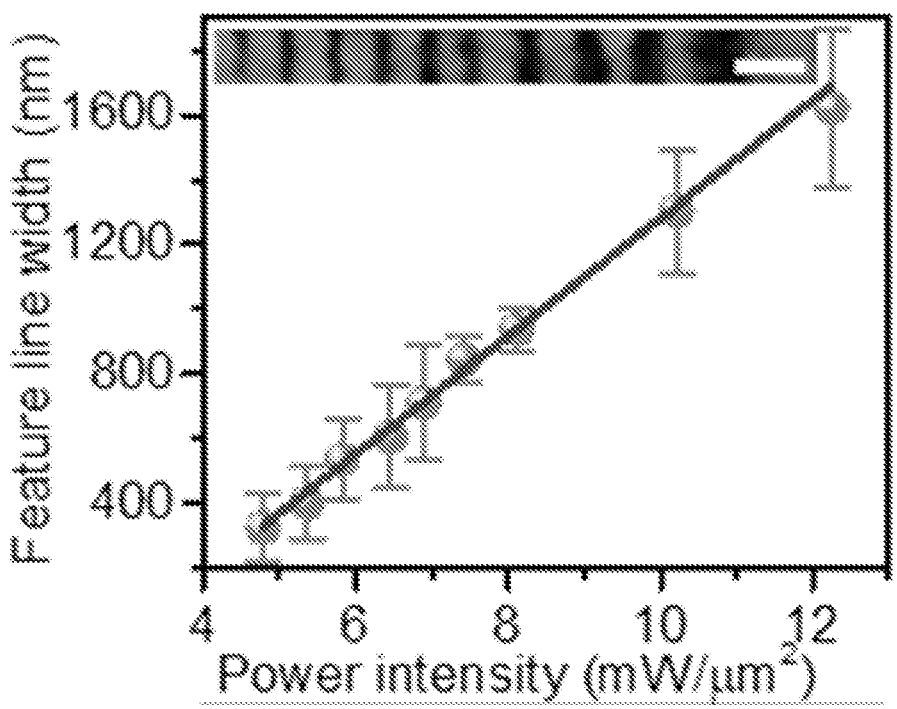
FIG. 17 shows the power intensity dependent feature line width on MoS$_2$. A linear relationship between feature line width and power intensity was obtained. The inset shows the Raman mapping image of MoS$_2$ nanoribbons ($A_{1g}$ peak) in a corresponding patterned area. Red or grey stands for high Raman intensity and black represents low Raman intensity. Scale bar in inset: 2 μm.
Figure 18:
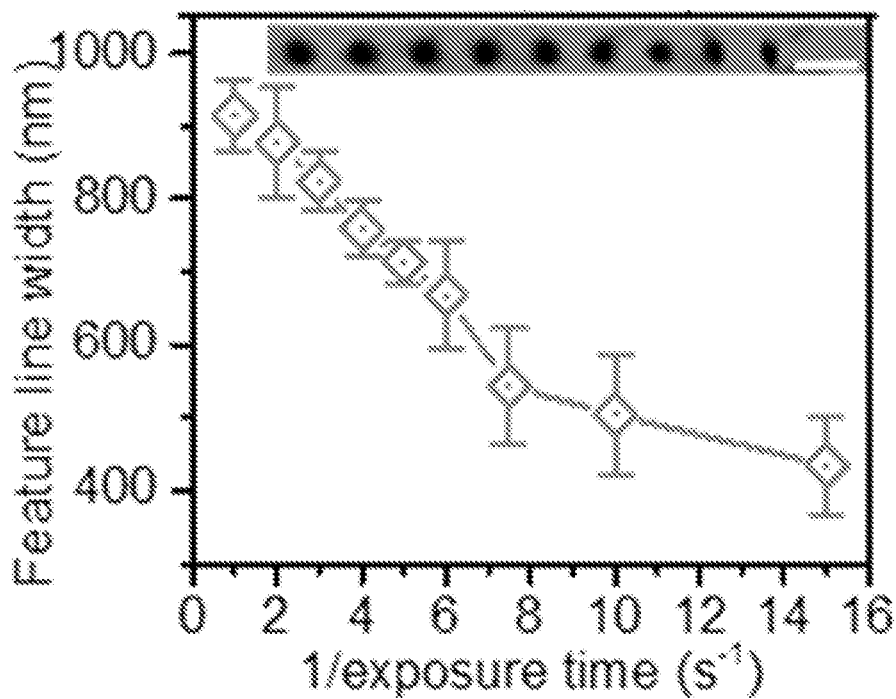
FIG. 18 shows the exposure time dependent feature size on graphene. The inset shows the Raman mapping image a graphene nanohole array (2D peak) in a corresponding patterned area. Red or grey stands for high Raman intensity and black represents low Raman intensity. Scale bar in inset: 2 μm.

To evaluate the patterning tunability of OTNL, the feature size of the patterned 2D materials was examined by monitoring the Raman patterns of the patterned 2D materials. A set of lines on $MoS_2$ were created under different incident power with the same scanning speed (inset in FIG. 17). The linewidth increases linearly from 300 nm to 1.6 µm as the optical power increases from 4.8 mW/µm$^2$ to 12.2 mW/µm$^2$. A minimum linewidth of 300 nm was observed with an incident power intensity of 4.8 mW/µm$^2$. This optical intensity is about 2 orders of magnitude lower than the optical intensity reported in previous works (0.14-2 W/µm$^2$) (Yoo et al. *MRS Bull.* 2016, 41, 1002; Sahin et al. *Appl. Phys. Lett.* 2014, 104, 053118; Paradisanos et al. *Appl. Phys. Lett.* 2014, 105, 041108; Stöhr et al. *ACS Nano* 2011, 5, 5141; Castellanos-Gomez et al. *Nano Lett.* 2012, 12, 3187; Sahin et al. *Appl. Phys. A* 2014, 116, 555). The linewidth of remaining ribbon structure can be further reduced by engineering the laser beam shape. For example, by using phase-shifting plates or 2D vortex phase plates, the shaped laser beam profile can be shaped to beat the diffraction limit (Stöhr et al. *ACS Nano* 2011, 5, 5141). FIG. 18 shows a group of graphene nanoholes patterned with different exposure time under the same optical power; the diameter of the nanoholes decreases with the decreasing exposure time. A minimum hole diameter of 420 nm was obtained when exposed for 0.067 s. The feature size can also be further reduced by increasing the numerical aperture.

Figure 23:
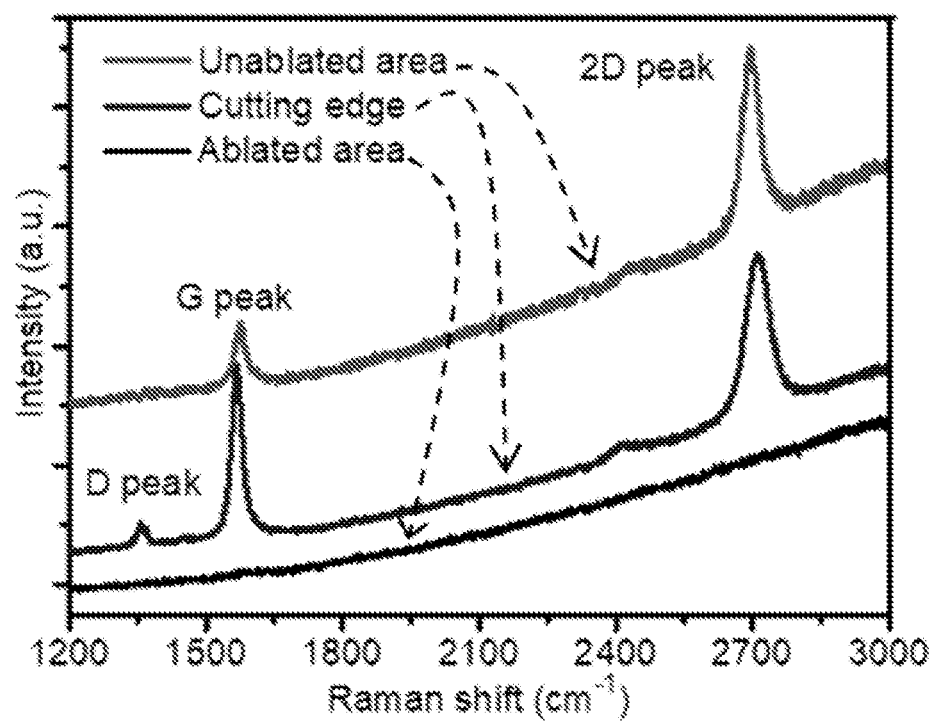
FIG. 23 is the Raman spectra recorded at different areas on graphene patterned in air. The magenta (top), blue (middle), and black (bottom) lines correspond to unpatterned area, cutting edge, and ablated area, respectively. A distinct D peak was observed at cutting edge.
Figure 24:
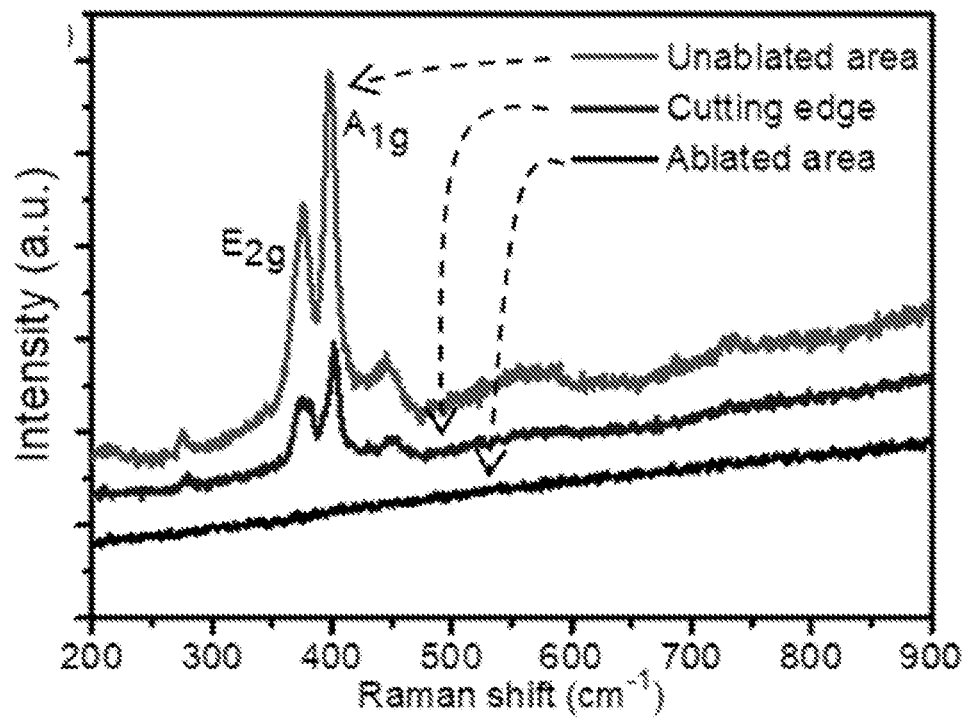
FIG. 24 is the Raman spectra recorded at different areas on $MoS_2$ patterned in air. The magenta (top), blue (middle), and black (bottom) lines correspond to unpatterned area, cutting edge, and ablated area, respectively.
Figure 25:
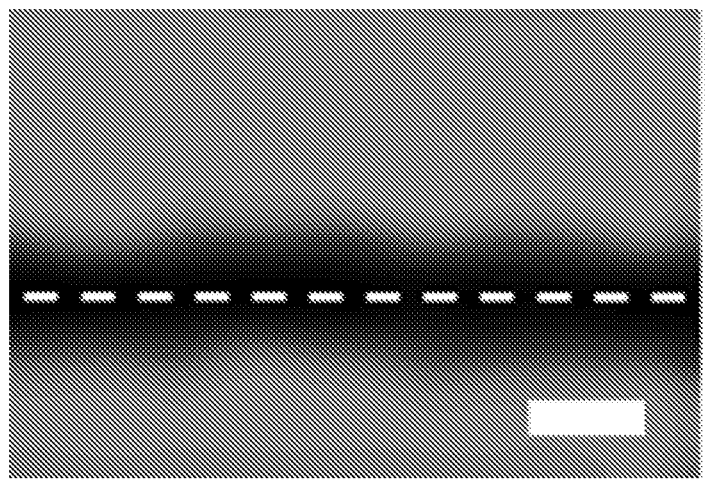
FIG. 25 is a Raman mapping image of the 2D peak, of graphene at the cutting edge. Red or grey stands for high Raman intensity and black represents low Raman intensity. The white dashed line corresponds to the laser scanned trajectory. Scale bar: 1 μm.
Figure 26:
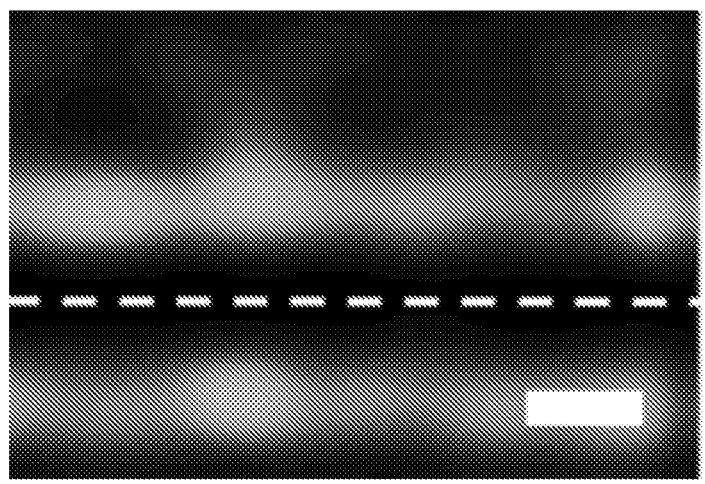
FIG. 26 is a Raman mapping image of the D peak of graphene at the cutting edge. Green or grey stands for high Raman intensity and black represents low Raman intensity. The white dashed line corresponds to the laser scanned trajectory. Scale bar: 1 μm.
Figure 27:
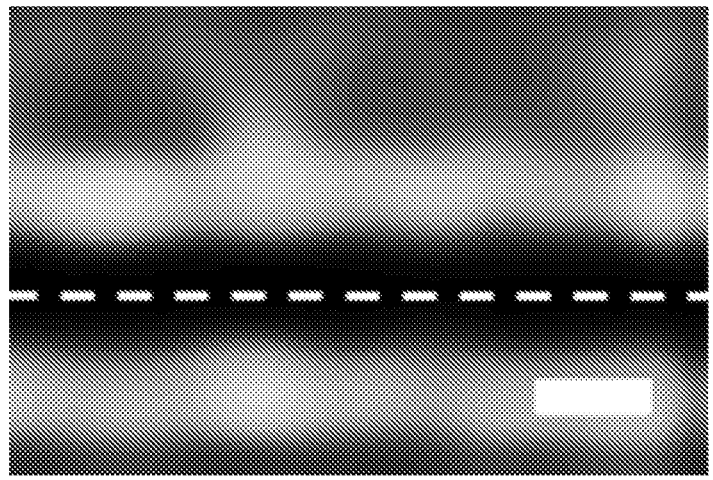
FIG. 27 is a Raman mapping image of a mix of the 2D peak and D peak of graphene at the cutting edge. Red/green/grey stands for high Raman intensity and black represents low Raman intensity. The white dashed line corresponds to the laser scanned trajectory. Scale bar: 1 μm.

To understand the interaction between the 2D materials and the temperature field, the Raman spectra of graphene and MoS$_2$ were compared at different regions, as summarized in FIG. 23 and FIG. 24. The absence of any significant Raman signal at the ablated area of the graphene and MoS$_2$ samples suggests that the 2D materials were completely removed after laser exposure, while pristine Raman spectra can be obtained in the unexposed regions, respectively. However, at the interface between the exposed and unexposed regions in the graphene patterns, i.e., the cutting edge, a distinct D band at ~1350 cm$^{-1}$ is observed (FIG. 23), which indicates the existence of defects due to graphene oxidation during laser ablation (Sahin et al. *Appl. Phys. Lett.* 2014, 104, 053118; Stöhr et al. *ACS Nano* 2011, 5, 5141; Ferrari et al. *Phys. Rev. Lett.* 2006, 97, 187401). A mapping of the D band in the graphene pattern shows a clear transition region at the etching edge (FIG. 25-FIG. 27), where the radiation dose is insufficient to ablate the graphene due to the Gaussian distribution of the temperature around the laser spot. For comparison, the Raman spectra at the etching edge of the MoS$_2$ samples were also exampled (FIG. 24). However, no significant signal from molybdenum oxide was observed, indicating that the ablation of MoS$_2$ is caused by lattice sublimation instead of molybdenum oxidation (Paradisanos et al. *Appl. Phys. Lett.* 2014, 105, 041108). Sublimation starts from the chemical bonds breaking in MoS$_2$ lattice and atoms begin to evaporate at the sublimation temperature, which for MoS$_2$ is 450° C. (Pan et al. *Sci. Rep.* 2016, 6, 19571).

Figure 28:
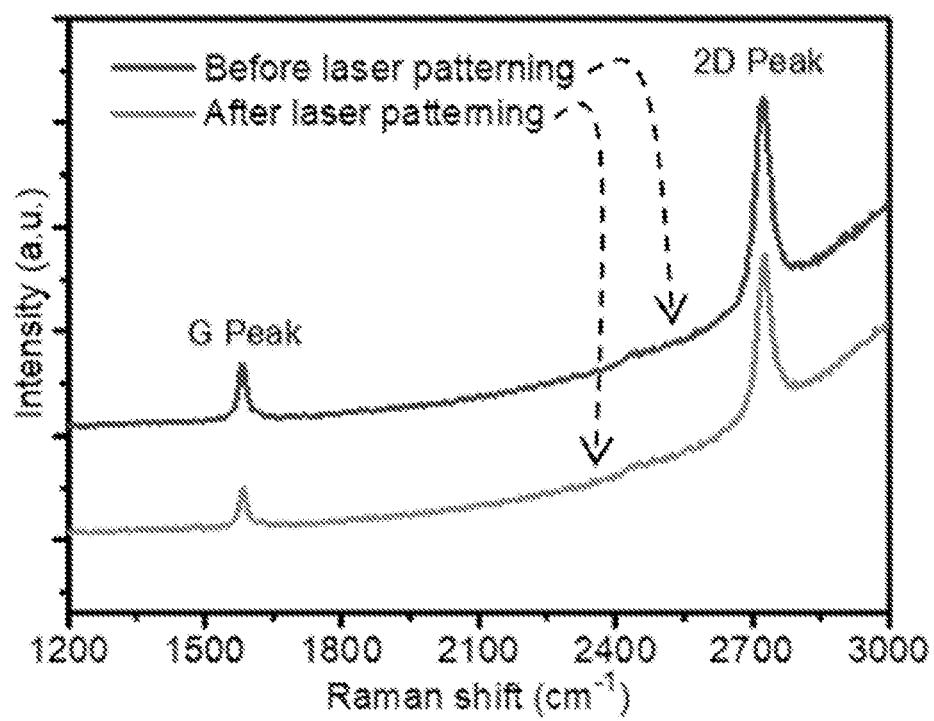
FIG. 28 is the Raman spectra recorded at different areas on graphene patterned with 25 nm $Al_2O_3$ on top as a protective layer against oxidation. The olive (top) and red (bottom) lines correspond to Raman spectra before and after laser patterning, respectively. After laser patterning, the Raman spectrum of graphene remained unchanged.
Figure 29:
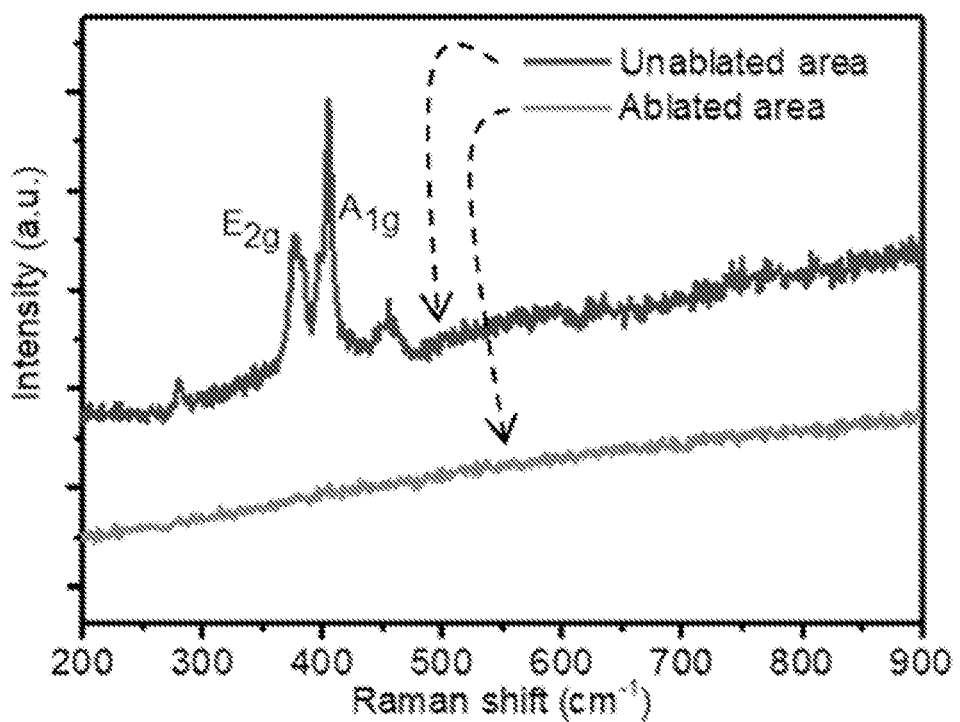
FIG. 29 is the Raman spectra recorded at different areas on $MoS_2$ patterned with 25 nm $Al_2O_3$ on top as a protective layer against oxidation. The olive (top) and red (bottom) lines correspond to Raman spectra before and after laser patterning, respectively. After laser patterning, the Raman signals of $MoS_2$ disappeared.
Figure 30:
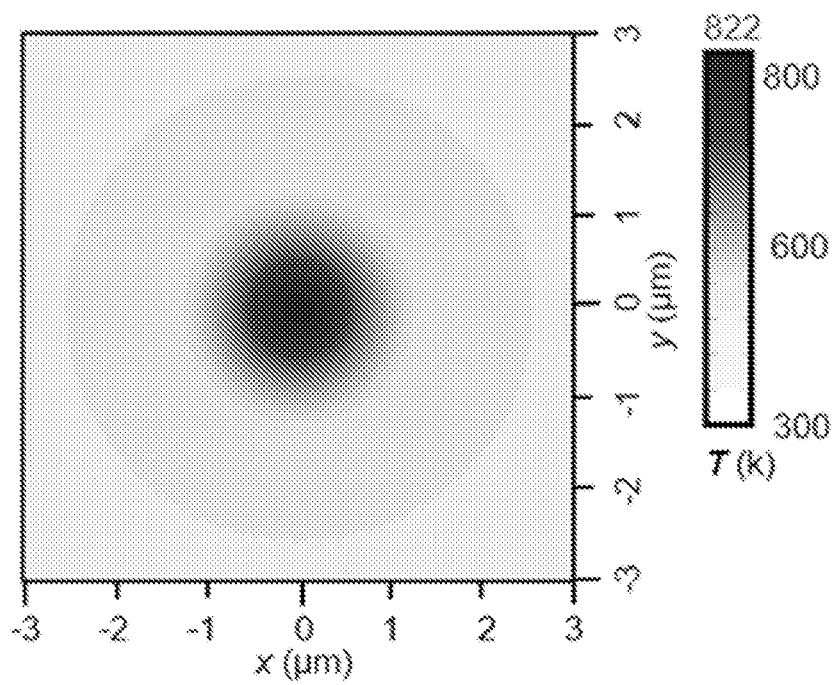
FIG. 30 is a temperature simulation of AuNIs/Si substrate without an $Al_2O_3$ layer on the top. The power was 50 mW and the diameter of laser beam was 1 μm.
Figure 31:
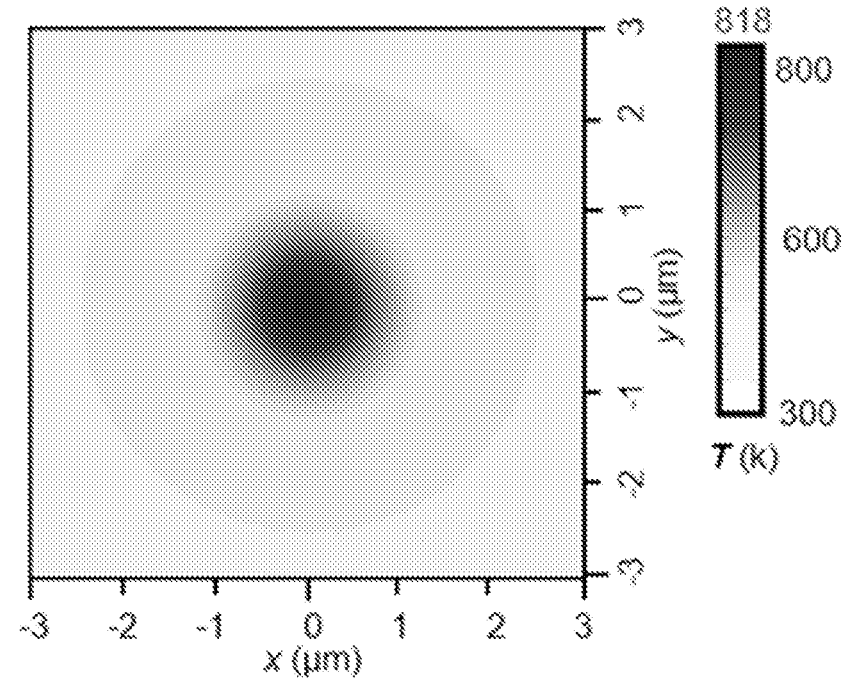
FIG. 31 is a temperature simulation of a AuNIs/Si substrate with 25 nm $Al_2O_3$ on the top. The temperature distribution of FIG. 30
Figure 32:
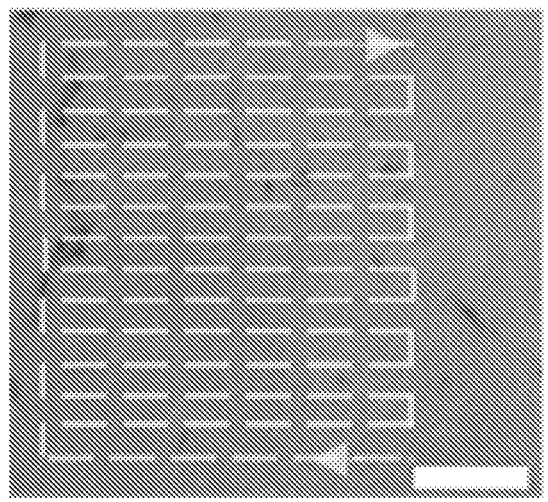
FIG. 32 is an optical image of graphene with 25 nm $Al_2O_3$ on top of AuNIs as a protective layer before laser patterning. The white dashed line and arrows indicate the laser trajectory. Scale bar: 5 μm.
Figure 33:
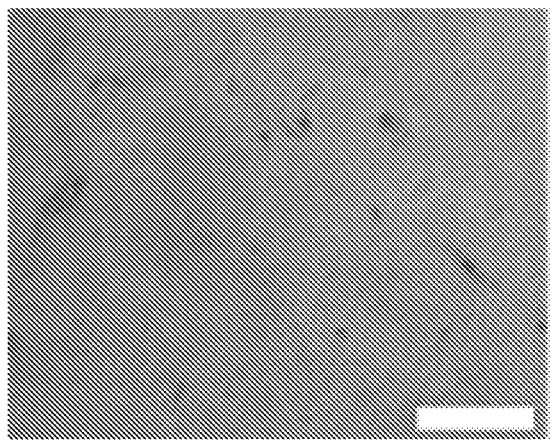
FIG. 33 is an optical image of graphene with 25 nm $Al_2O_3$ on top of AuNIs as a protective layer after laser patterning. The laser trajectory is shown by the white dashed line and arrows in FIG. 32. Scale bar: 5 μm.
Figure 34:
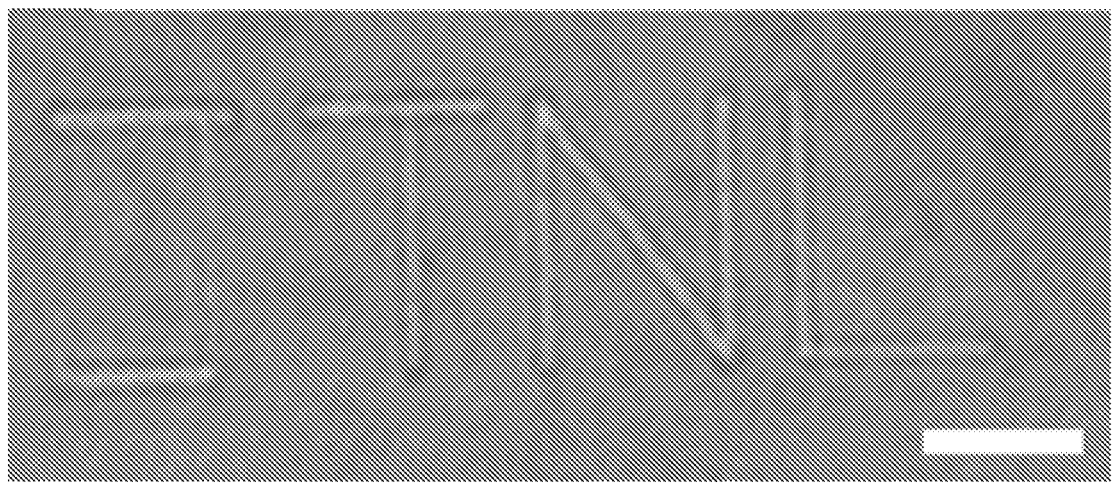
FIG. 34 is an optical image of "OTNL" patterned on $MoS_2$ with 25 nm $Al_2O_3$ on top of AuNIs as a protective layer. Scale bars: 5 μm.

To further verify that the graphene is ablated via oxidation while MoS$_2$ is ablated via sublimation, 25 nm Al$_2$O$_3$ thin films were coated on both graphene and MoS$_2$ using atomic layer deposition as a protective layer before optical patterning. Al$_2$O$_3$ was selected as a protective layer due to its capability of resisting oxidation at high temperatures (Taniguchi et al. *Mater. Trans. JIM* 1991, 32, 299; Cooper et al. *Thin Solid Films* 2008, 516, 4036). Based on the thermal conductivity: $\kappa_{silicon} > \kappa_{alumina} > \kappa_{glass} > \kappa_{air}$ (Haynes, *CRC Handbook of Chemistry and Physics*, CRC Press, Boca Raton, Fla. USA 2014), the Al$_2$O$_3$ thin film will lead to heat dissipation and reduce the maximum temperature during optical heating (Han et al. *ACS Nano* 2011, 5, 263). Thus, a silicon substrate was used in control experiments to avoid a dramatic temperature drop after Al$_2$O$_3$ coating. COMSOL simulation (FIG. 30-FIG. 31) shows that the Al$_2$O$_3$ film has a negligible effect on the temperature distribution on the silicon substrate. Silicon is an effective heat sink and the replacement of glass by silicon as the substrate means that a much higher optical power is needed to achieve patterning (Han et al. *ACS Nano* 2011, 5, 263). The Raman spectra for the graphene and MoS$_2$ samples coated with a protective Al$_2$O$_3$ layer before and after optical patterning were compared (FIG. 28 and FIG. 29). After Al$_2$O$_3$ coating, the graphene monolayer is protected from ablation, while the optical patterning of MoS$_2$ remains achievable (FIG. 32-FIG. 34). These results reveal that graphene patterning is an oxygen-participated process and can be rationally controlled by tuning the oxygen diffusion into the graphene monolayer. In contrast, the patterning of MoS$_2$ is independent of the surrounding oxygen concentration, which confirms the sublimation mechanism. Sublimation of graphene can be further excluded since the sublimation temperature is over 2000° C. (Huang et al. *Nano Res.* 2010, 3, 43; Huang et al. *P. Natl. Acad. Sci. U.S.A.* 2009, 106, 10103), which is much higher than the maximum temperature in our work. Meanwhile, the minimum oxidation temperature of graphene is 450° C. (Liu et al. *Nano Lett.* 2008, 8, 1965).

Figure 35:
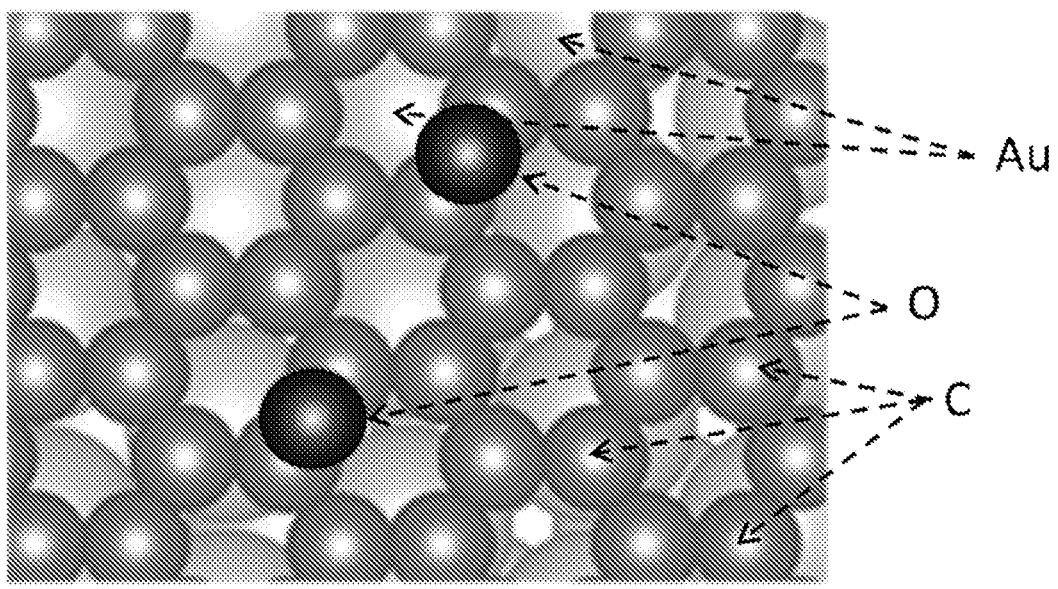
FIG. 35 is a top view of two O atoms adsorbed on graphene supported on a Au surface modeled using DFT. The red, brown and gold balls represent O, C and Au atoms, respectively.
Figure 36:
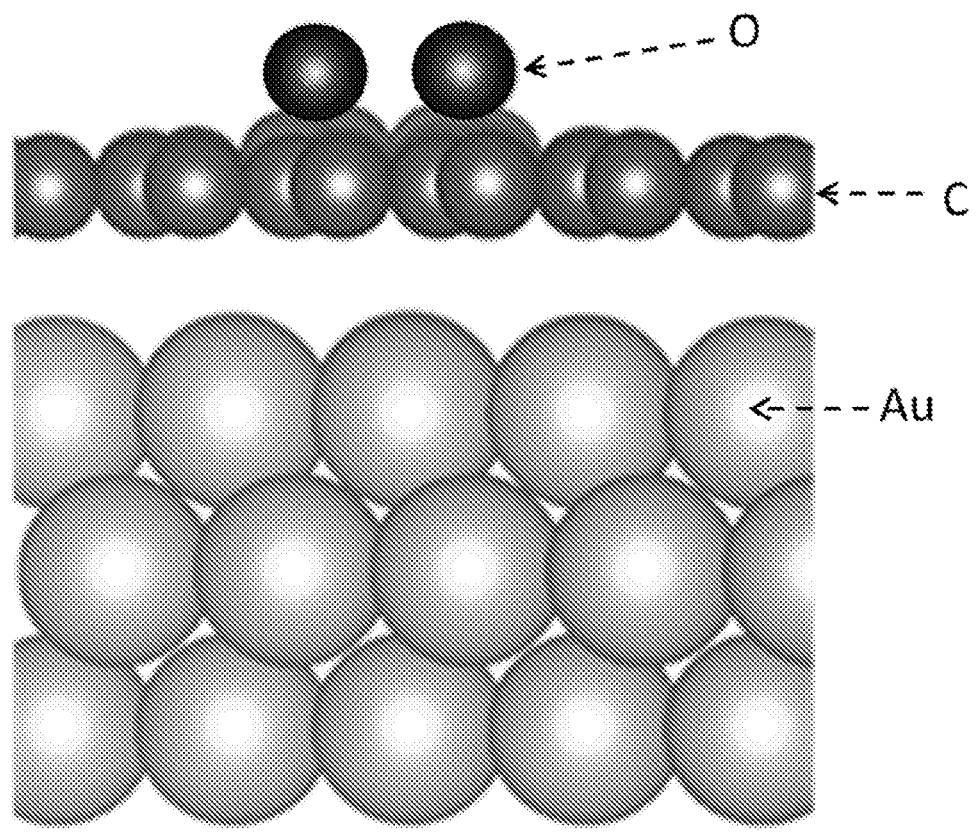
FIG. 36 is a side view of two O atoms adsorbed on graphene supported on a Au surface modeled using DFT. The red, brown and gold balls represent O, C and Au atoms, respectively.
Figure 37:
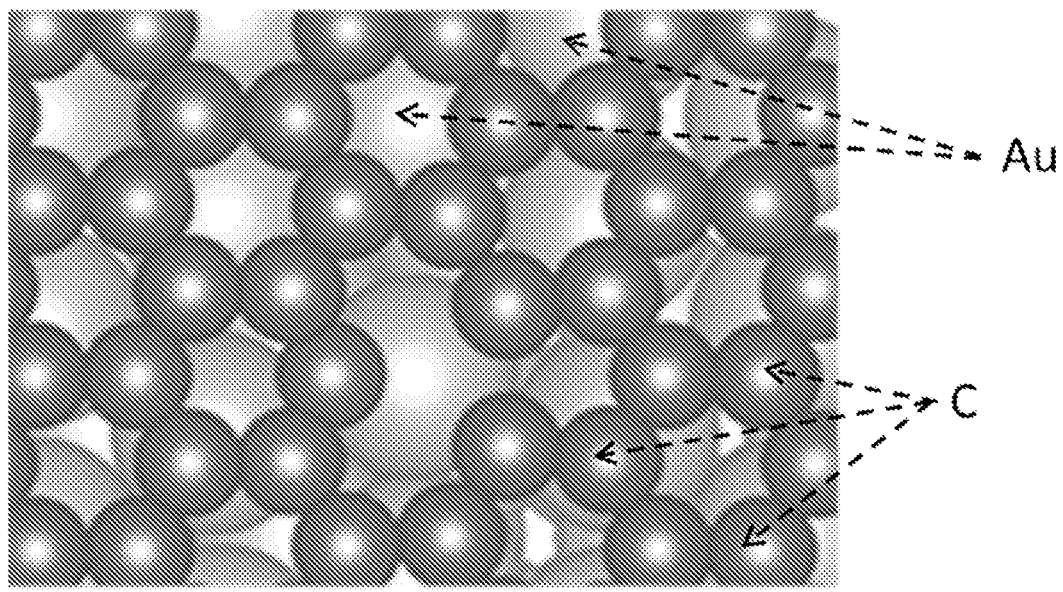
FIG. 37 is a top view of graphene with one C vacancy supported on Au surface modeled via DFT. The brown and gold balls represent C and Au atoms, respectively.
Figure 38:
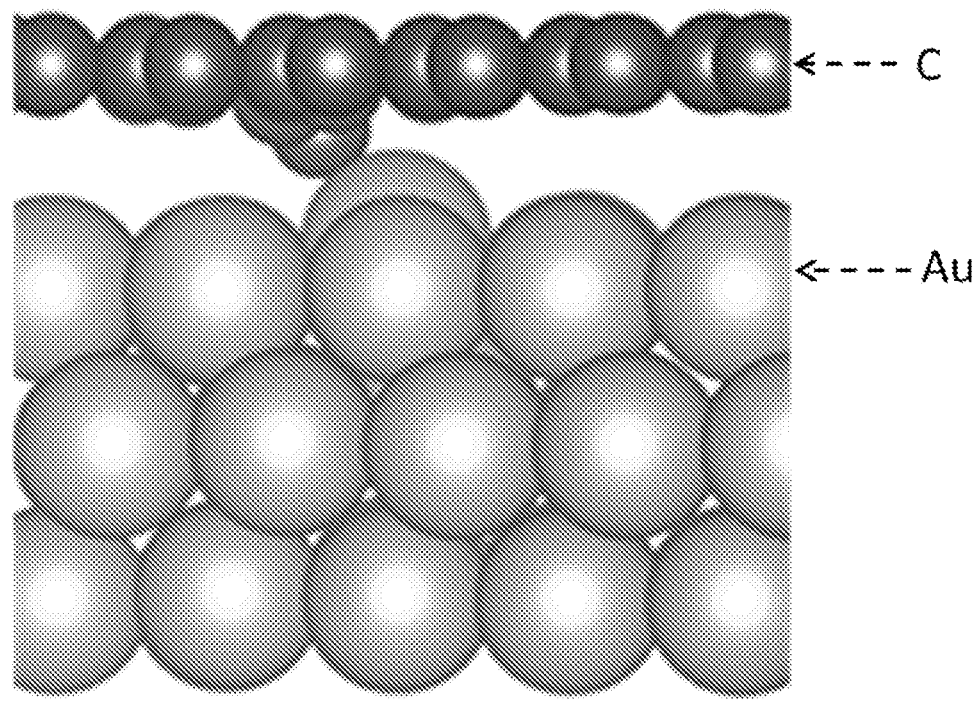
FIG. 38 is a side view of graphene with one C vacancy supported on Au surface modeled using DFT. The brown and gold balls represent O, C and Au atoms, respectively.
Figure 39:
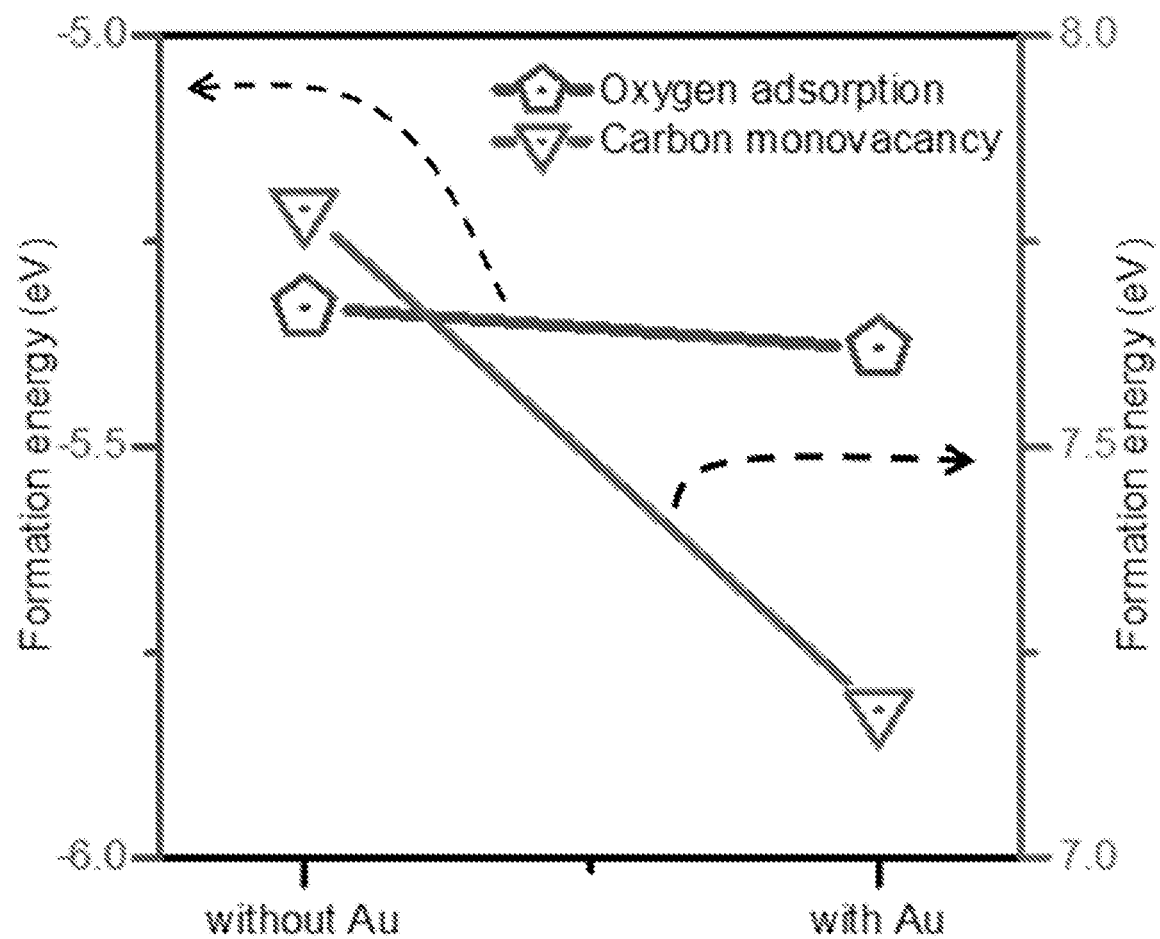
FIG. 39 shows a comparison of the DFT calculated formation energies of oxygen adsorption and carbon monovacancy with Au and without Au.

DFT simulations were performed to elucidate the role of the thermoplasmonic substrate in graphene patterning beyond the plasmon-enhanced optical heating effects provided by the thermoplasmonic substrate. A graphene monolayer was placed on the top of the gold (111) surface, and two oxygen atoms were introduced to model the oxidization process. The oxidation process starts from O$_2$ dissociation on graphene, and two oxygen atoms take out one carbon atom to form CO$_2$, leaving a monovacancy in graphene (Huang et al. *P. Natl. Acad. Sci. U.S.A.* 2009, 106, 10103). The formation energies of both oxygen adsorption (FIG. 35 and FIG. 36) and the carbon monovacancy (FIG. 37 and FIG. 38) were calculated, and the results were compared with the formation energies calculated in freestanding graphene. the presence of the gold surface did not significantly change the energy of oxygen adsorption on graphene (with the energy difference <50 meV), but it reduced the formation energy of a carbon monovacancy by 0.6 eV (FIG. 39). The stabilization of the carbon monovacancy arises from the bonding between under-coordinated C and Au (FIG. 37-FIG. 38), indicating that the Au nanoparticles on the thermoplasmonic substrate can catalyze graphene oxidation beyond the improvement of optical heating.

Figure 40:
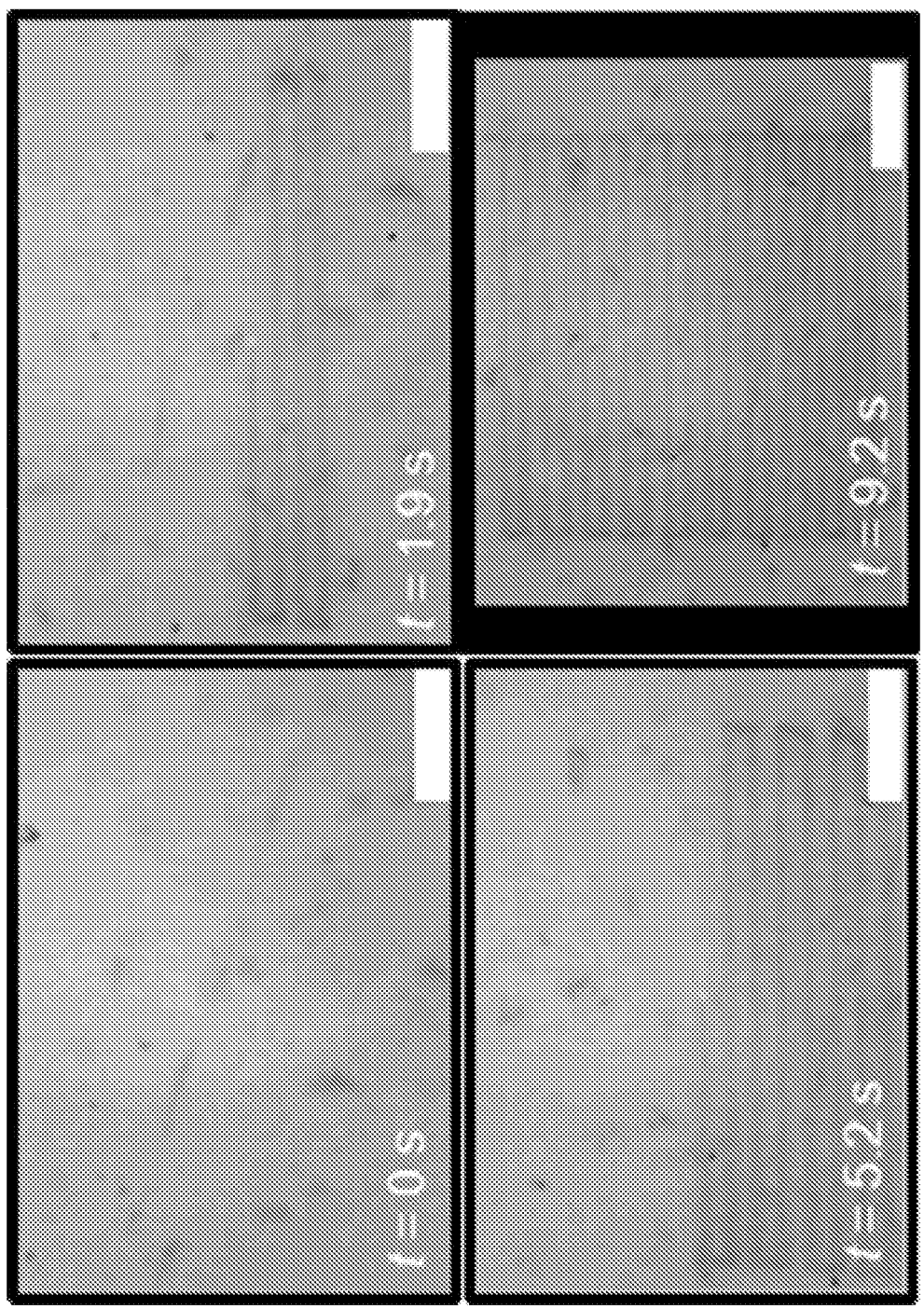
FIG. 40 is a series of sequential optical images of real-time patterning of 40 μm×40 nanoribbon structures on graphene. The line width is 600 nm and the periodicity is 2 μm. Scale bars: 10 μm.
Figure 41:
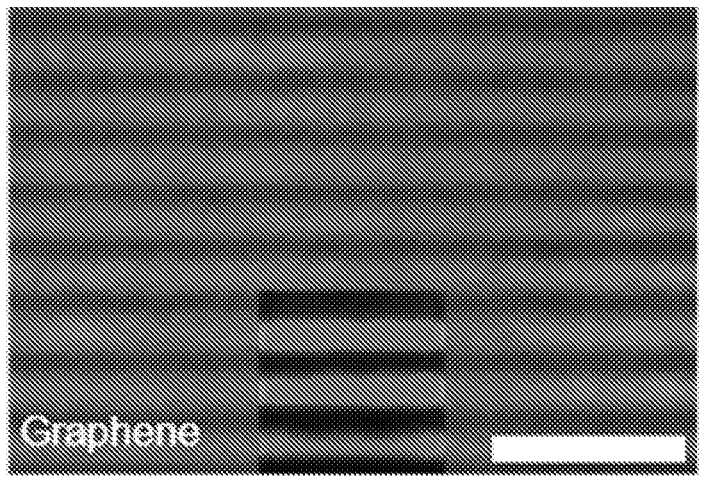
FIG. 41 is an optical image of a graphene nanoribbon structure with a line width of 950 nm and a periodicity of 1.6 μm. The inset shows the 2D Raman mapping image of the graphene 2D peak in the corresponding areas. Red or grey stands for high Raman intensity and black represents low Raman intensity. Scale bar: 5 μm.
Figure 42:
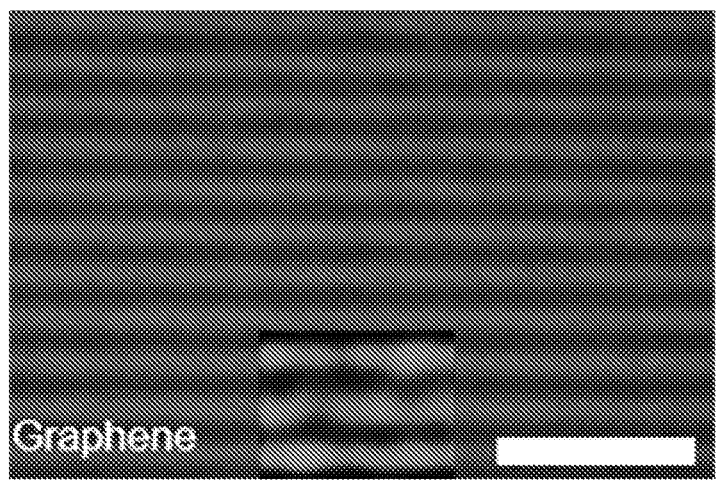
FIG. 42 is an optical image of a graphene nanoribbon structure with a line width of 650 nm and a periodicity of 1.35 μm. The inset shows the 2D Raman mapping image of the graphene 2D peak in the corresponding areas. Red or grey stands for high Raman intensity and black represents low Raman intensity. Scale bar: 5 μm.
Figure 43:
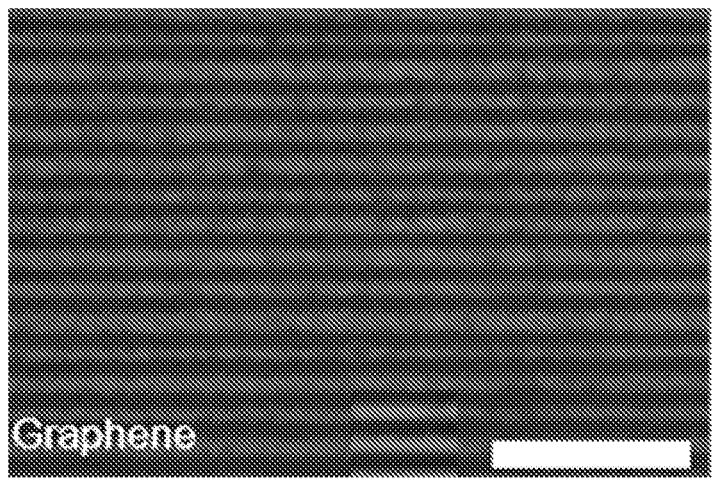
FIG. 43 is an optical image of a graphene nanoribbon structure with a line width of 500 nm and a periodicity of 0.95 μm. The inset shows the 2D Raman mapping image of the graphene 2D peak in the corresponding areas. Red or grey stands for high Raman intensity and black represents low Raman intensity. Scale bar: 5 μm.
Figure 44:
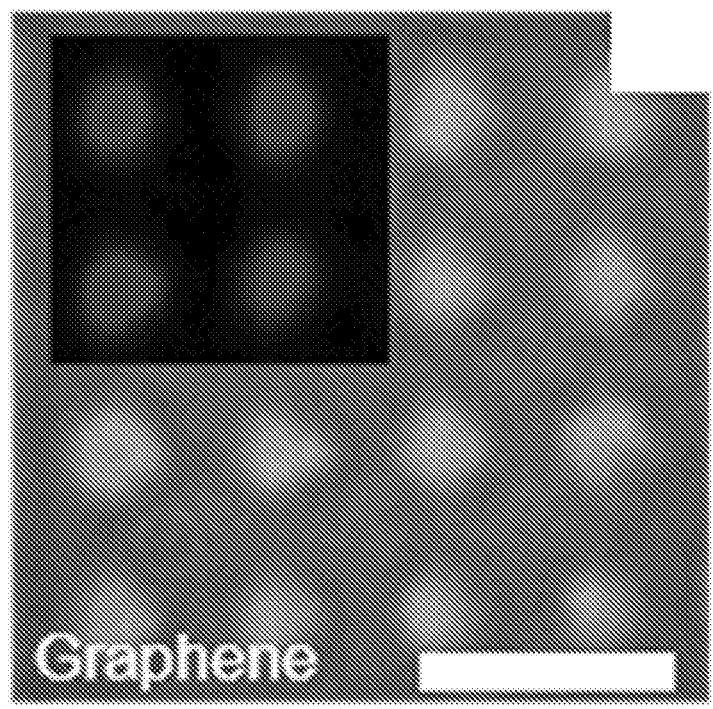
FIG. 44 is an optical image of a graphene nanodisk array (NDA) with a diameter of 1.8 μm. The inset shows the 2D Raman mapping image of the graphene 2D peak in the corresponding areas. Red or grey stands for high Raman intensity and black represents low Raman intensity. Scale bar: 5 μm.
Figure 45:
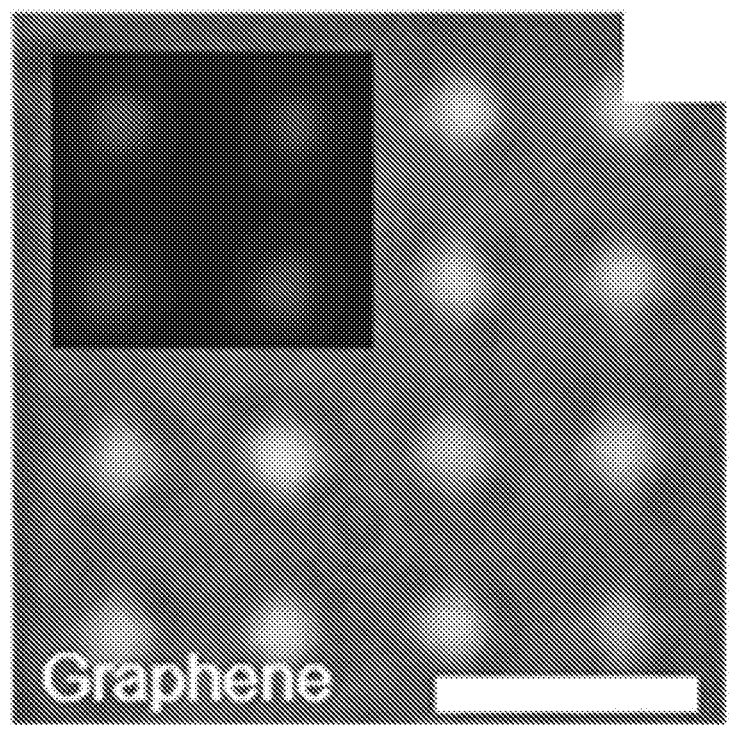
FIG. 45 is an optical image of a graphene nanodisk array (NDA) with a diameter of 1.2 μm. The inset shows the 2D Raman mapping image of the graphene 2D peak in the corresponding areas. Red or grey stands for high Raman intensity and black represents low Raman intensity. Scale bar: 5 μm.
Figure 46:
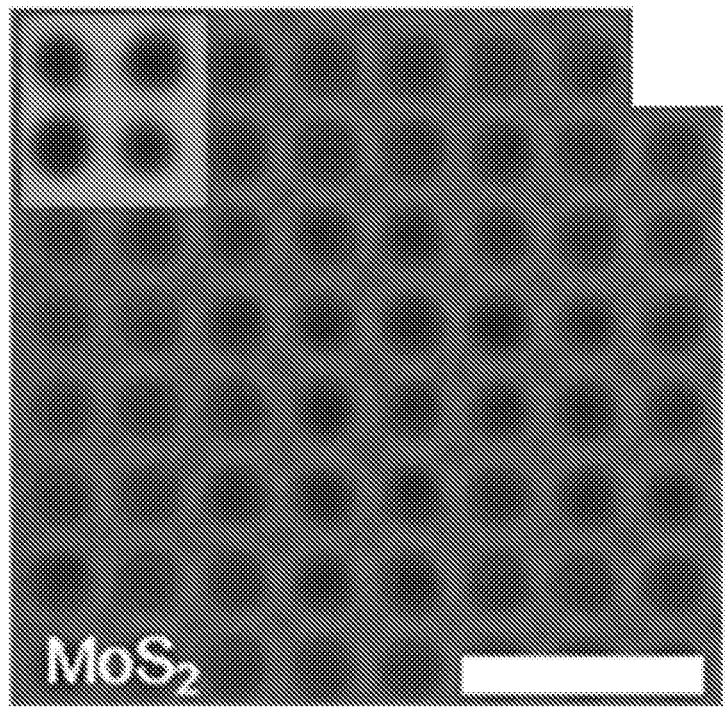
FIG. 46 is an optical image of a nanohole array (NHA) patterned on $MoS_2$ where the holes have a diameter of 1.1 μm. The inset shows the 2D Raman mapping images of the $MoS_2$ $A_{1g}$ peak in the corresponding areas. Red or grey stands for high Raman intensity and black represents low Raman intensity. Scale bar: 5 μm.
Figure 47:
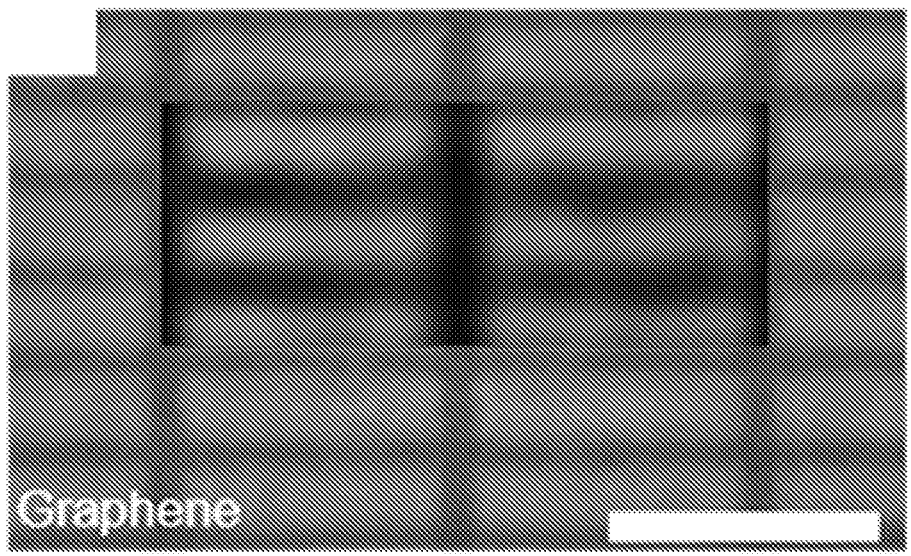
FIG. 47 is an optical image of a graphene nanorectangle array with a geometry of 5 μm×1 μm. The inset shows the 2D Raman mapping image of the graphene 2D peak in the corresponding areas. Red or grey stands for high Raman intensity and black represents low Raman intensity. Scale bar: 5 μm.

The versatility of OTNL for fabrication of diverse 2D patterns was further demonstrated. As shown in FIG. 41-FIG. 43, graphene nanoribbon arrays with different feature sizes were created. While adjusting the laser scan-line period (1.6 µm, 1.35 µm and 0.95 µm), graphene nanoribbons were fabricated with linewidths of 950 nm (FIG. 41), 650 nm (FIG. 42) and 500 nm (FIG. 43). FIG. 40 shows the real-time patterning of the graphene nanoribbon structure. OTNL was also demonstrated to have a high throughput, as a pattern a 40 µm×40 µm nanoribbon array can be patterned in less than 10 seconds. Two-dimensional graphene nanodisk arrays can also be fabricated through optical etching of surrounding graphene and controlling the sizes and shapes of the remaining graphene, as shown in FIG. 44 and FIG. 45. Other periodic structures including a MoS$_2$ nanohole array (FIG. 46) and a graphene nanorectangle array (FIG. 47) were also readily fabricated. The striking contrast in all Raman images verifies the excellent quality control of the 2D patterns. The precise control of the feature size and periodicity in a graphene monolayer can facilitate the optical fabrication of graphene terahertz devices for optical sensing and photon detection (Ju et al. *Nat. Nanotechnol.* 2011, 6, 630; Rodrigo et al. *Science* 2015, 349, 165).

Figure 48:
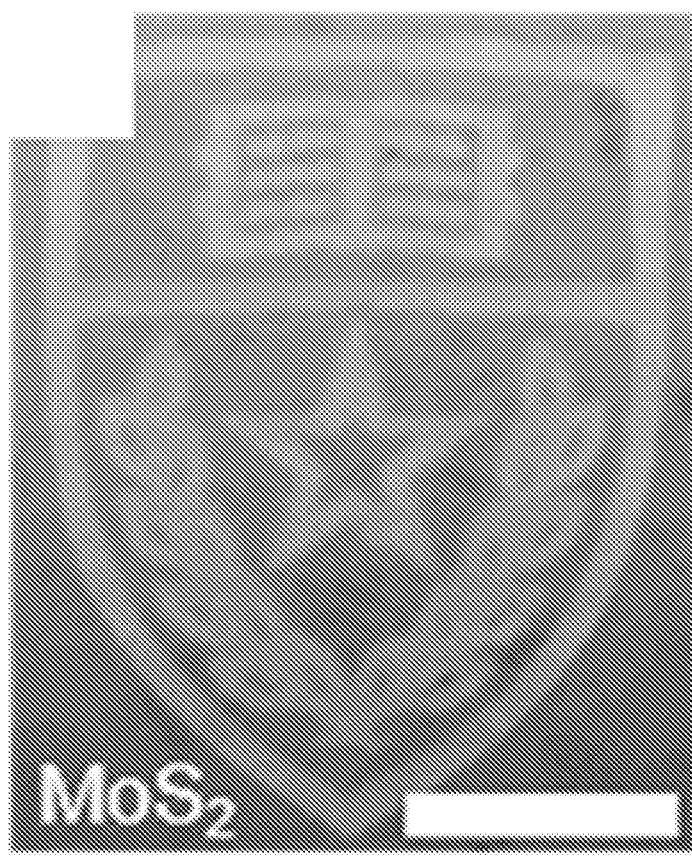
FIG. 48 is an optical image of a UT Austin logo patterned on $MoS_2$. Scale bar: 50 μm.
Figure 49:
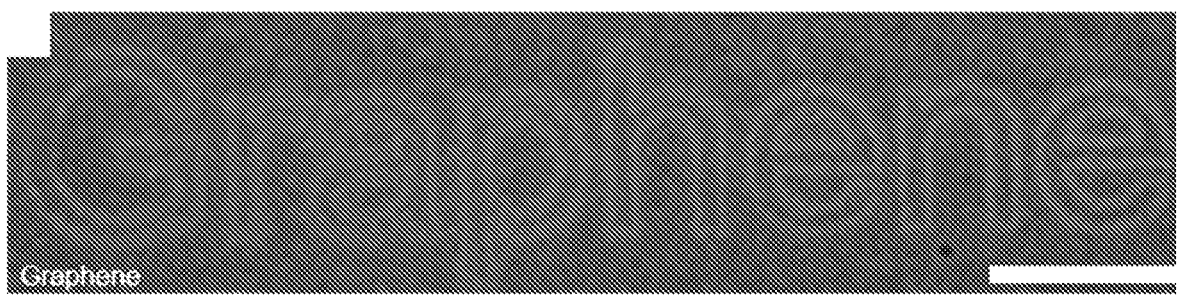
FIG. 49 is an optical image of "Graphene" text patterned on graphene. The linewidth is ~1.5 μm. Scale bar: 50 μm.

OTNL can also be used to create non-periodic nanostructures with complex patterns. Through programming the sample stage, the patterning of a UT-Austin logo on $MoS_2$ monolayer (FIG. 48) and "Graphene" text created on graphene monolayer (FIG. 49) were demonstrated. The UT-Austin logo was patterned by a raster scanning of stage with a 1 μm line space in conjunction with a shutter to determine an on/off state of the patterning. The acceleration of stage was set to be 2.4 $cm/s^2$ and the highest speed was ~1 cm/s. The total time required to fabricate this large-area pattern (150 μm×120 μm) was less than 15 min.

Figure 50:
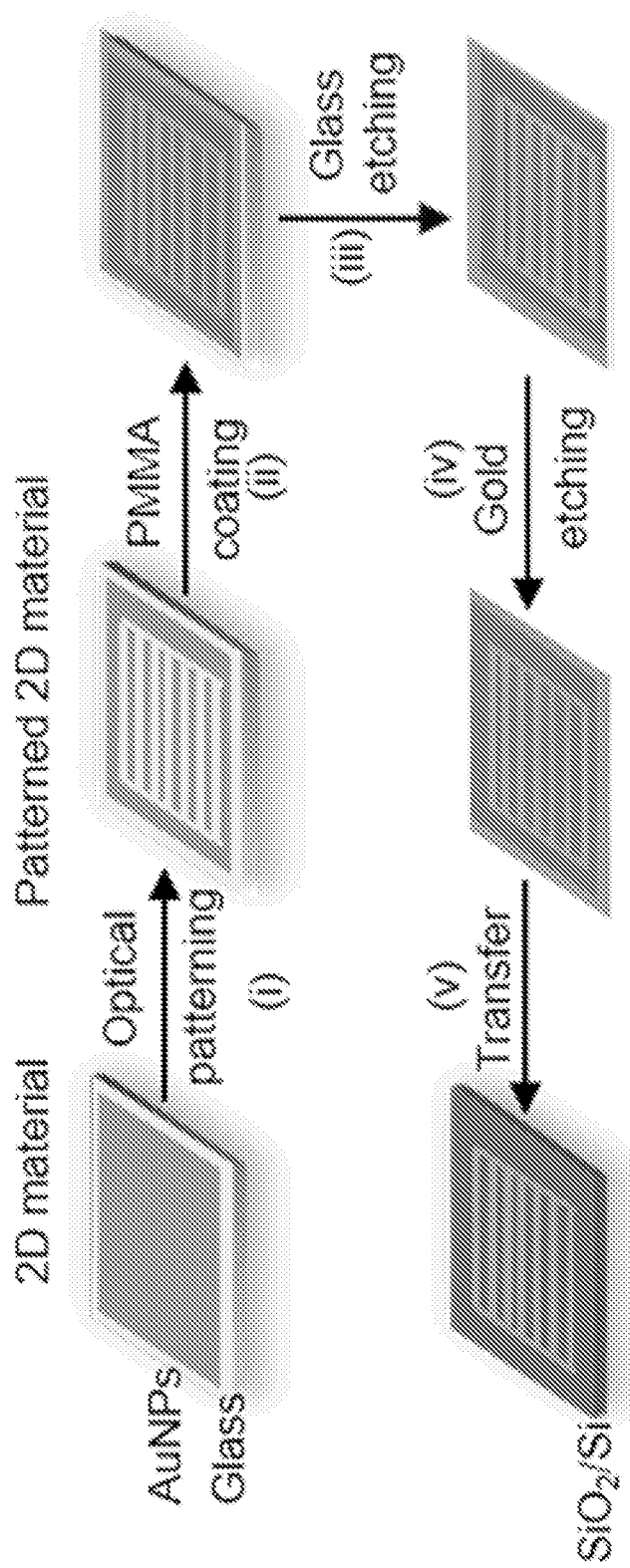
FIG. 50 is a schematic diagram showing the process of the transferring patterned 2D materials from a thermoplasmonic substrate to a $SiO_2$/Si substrate. The process includes (i) Optical patterning of 2D materials; (ii) PMMA coating; (iii) glass etching by HF solution; (iv) gold etching by $KI/I_2$ solution; (v) transfer to $SiO_2$/Si substrate.
Figure 51:
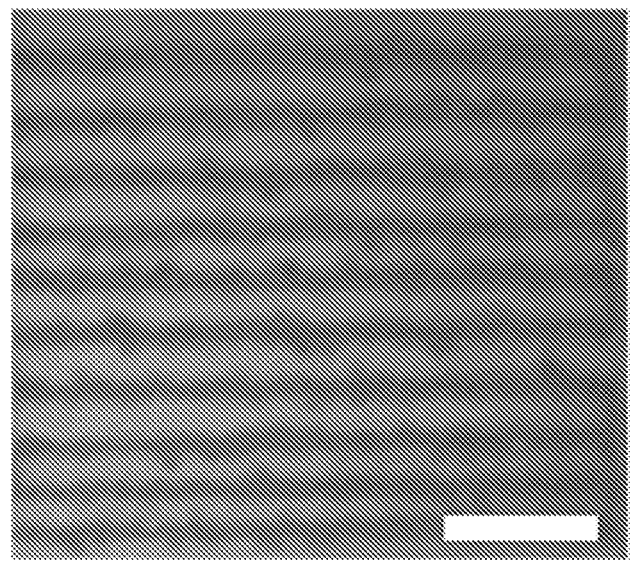
FIG. 51 is an optical image of a $MoS_2$ grating structure on a thermoplasmonic substrate. Scale bar: 5 μm.
Figure 52:
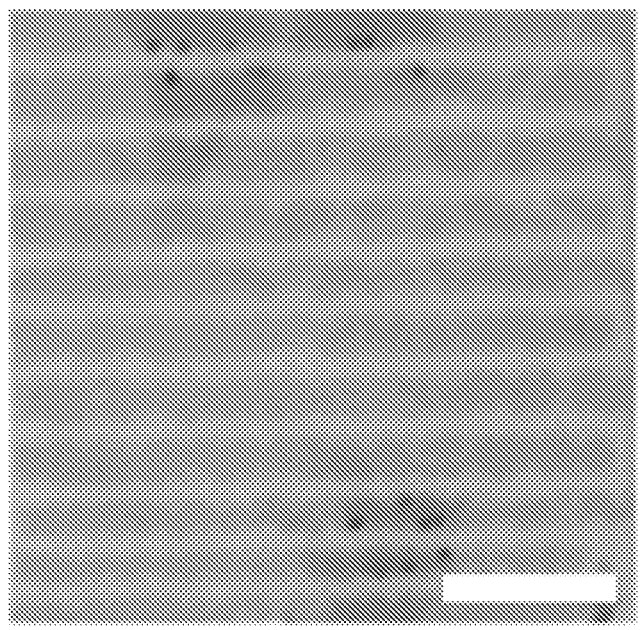
FIG. 52 is an optical image of the same MoS$_2$ grating structure of FIG. 51, but on a SiO$_2$/Si substrate. Scale bar: 5 μm.
Figure 53:
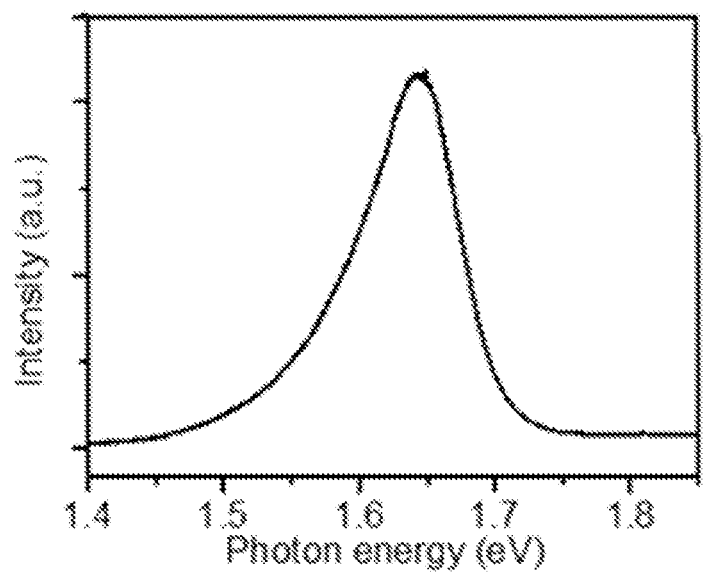
FIG. 53 is the photoluminescence (PL) spectrum of WSe$_2$.
Figure 54:
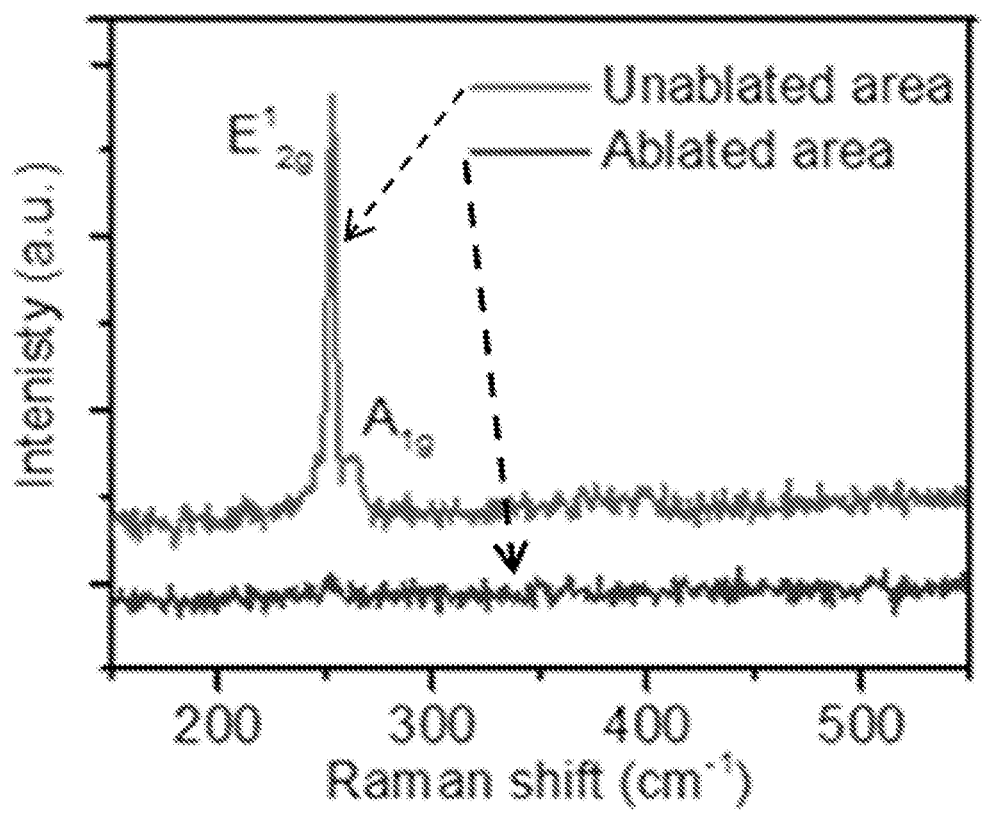
FIG. 54 is the Raman spectra of WSe$_2$ patterned via OTNL recorded at different (ablated vs unablated) areas.
Figure 55:
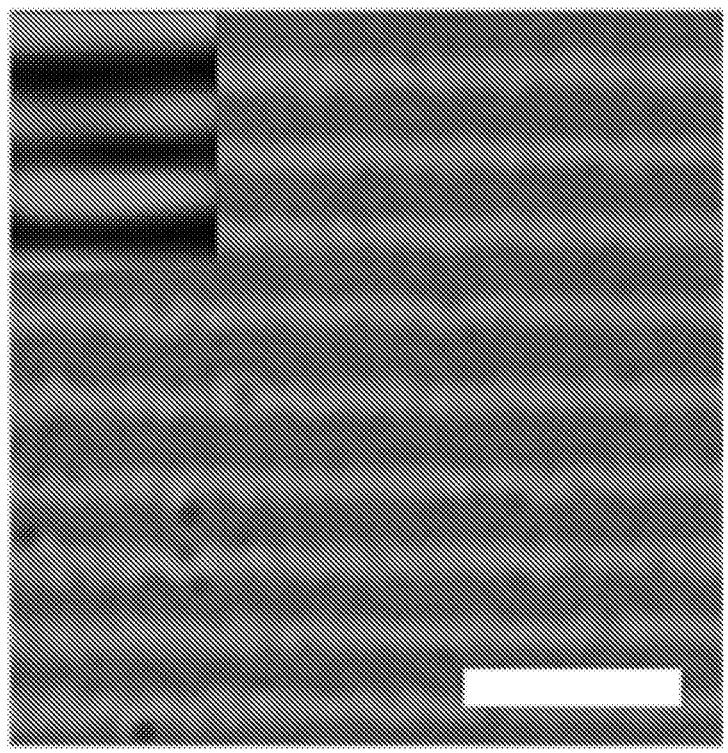
FIG. 55 is an optical image showing the WSe$_2$ grating structure patterned via OTNL. The inset shows the Raman mapping of E$^1_{2g}$ peak of WSe$_2$ in the corresponding area. Red or grey stands for high Raman intensity and black represents low Raman intensity Scale bar: 5 μm.

The presence of gold nanoparticles beneath the 2D materials can modify the intrinsic electrical and optical properties of the 2D materials, e.g., photoluminescence quenching (Bhanu et al. *Sci. Rep.* 2014, 4, 5575). However, this drawback can be substantially eliminated by transferring the patterned 2D materials to other non-plasmonic substrates (e.g., $SiO_2$/Si substrate) (FIG. 50-FIG. 52). Besides graphene and $MoS_2$, OTNL can be applied to a variety of other 2D materials that can be ablated at the temperature generated by the thermoplasmonic substrate. As another demonstration, a $WSe_2$ grating structure was created at an optical power of 5 $mW/μm^2$ (FIG. 53-FIG. 55).

Opto-thermoplasmonic nanolithography (OTNL) was developed for low-power, high-throughput, and on-demand patterning of different 2D materials. A variety of variable high-resolution patterns were fabricated on 2D monolayers through exploiting thermal oxidation and sublimation at the localized thermoplasmonic hot spots. OTNL offers the scalable fabrication of nanostructured 2D materials for various applications.

Figure 56:
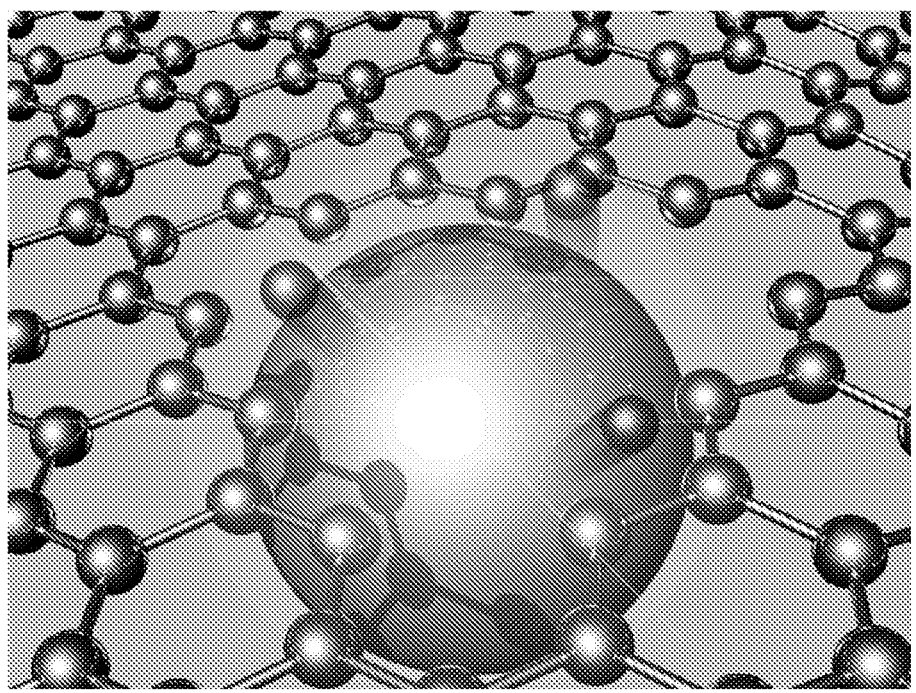
FIG. 56 is a schematic diagram of opto-thermoplasmonic nanolithography (OTNL) patterning on 2D monolayers through exploiting thermal oxidation and sublimation at the localized thermoplasmonic hot spots.

Opto-thermoplasmonic nanolithography (OTNL) described herein can be used for on-demand and high-throughput patterning of different 2D materials through coordinated management of both plasmon-enhanced optothermal response and the heat-matter interaction in the optically controlled temperature field. The experiments and simulations revealed that thermal oxidation and gold catalysis are involved in the low-power patterning of graphene, while $MoS_2$ patterning is an oxygen-irrelevant process related instead to lattice sublimation. Taking advantage of the localized thermal hot spots confined by the high-density gold nanoparticles and the flexible management of light, high-resolution patterning of arbitrary 2D patterns was demonstrated (FIG. 56). Although the optical patterning used a thermoplasmonic substrate, the patterned 2D materials can be transferred to alternative substrates by selective etching of the Au layer. Though the experiments demonstrated patterning of graphene and $MoS_2$ monolayers, OTNL can be applied to various 2D materials for the fabrication of diverse nanostructures with precise control for diverse applications. For example, the optical patterning of graphene nanostructures can facilitate the development of terahertz photonic devices for applications in bio-sensing and photon detection. In addition, the patterning of semiconductor 2D materials can be used for 2D electronic devices such as field-effect transistors.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims.

Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A method of patterning a two-dimensional atomic layer material, the method comprising:
   illuminating a first location of an optothermal substrate with electromagnetic radiation;
      wherein the electromagnetic radiation has a power density of from 0.1 $mW/μm^2$ to 5 $mW/μm^2$;
         wherein the optothermal substrate comprises a plasmonic substrate having a plasmon resonance energy and the electromagnetic radiation comprises a wavelength that overlaps with at least a portion of the plasmon resonance energy of the plasmonic substrate, such that the optothermal substrate converts at least a portion of the electromagnetic radiation into thermal energy via plasmon-enhanced photothermal effects; and
      wherein the optothermal substrate is in thermal contact with a two-dimensional atomic layer material;
   thereby:
      generating an ablation region at a location of the two-dimensional atomic layer material proximate to the first location of the optothermal substrate via plasmon-enhanced photothermal effects, wherein at least a portion of the ablation region has a temperature sufficient to ablate at least a portion of the two-dimensional atomic layer material within the ablation region; and
      ablating at least a portion of the two-dimensional atomic layer material within the ablation region proximate to the first location of the optothermal substrate;
      thereby patterning the two-dimensional atomic layer material.

2. The method of claim 1, wherein the electromagnetic radiation has a power density of from 0.1 $mW/μm^2$ to 2.5 $mW/μm^2$.

3. The method of claim 1, wherein the electromagnetic radiation is provided by a laser.

4. The method of claim 1, wherein the electromagnetic radiation is provided by a light source and the light source is configured to illuminate a mirror and the mirror is configured to reflect the electromagnetic radiation from the light source to illuminate the first location of the optothermal substrate.

5. The method of claim 1, wherein the two-dimensional atomic layer material comprises a transition metal dichalcogenide, hexagonal BN, graphene, black phosphorous, or combinations thereof.

6. The method of claim 1, wherein the two-dimensional atomic layer material comprises a transition metal dichalcogenide selected from the group consisting of $MoS_2$, $WSe_2$, $MoTe_2$, $WS_2$, and combinations thereof.

7. The method of claim 1, wherein the two-dimensional atomic layer material is disposed on the optothermal substrate.

8. The method of any one of claim 1, wherein the ablation region has a diameter of from 300 nm to 10 μm.

9. The method of claim 1, wherein the portion of the two-dimensional atomic material is ablated in an amount of time of $10^4$ seconds to 10 seconds.

10. The method of claim 1, further comprising illuminating a second location of the optothermal substrate, thereby:
generating a second ablation region at a location of the two-dimensional atomic layer material proximate to the second location of the optothermal substrate via plasmon-enhanced photothermal effects, wherein at least a portion of the second ablation region has a temperature sufficient to ablate at least a portion of the two-dimensional atomic layer material within the second ablation region; and
ablating at least a portion of the two-dimensional atomic layer material within the second ablation region proximate to the second location of the optothermal substrate.

11. The method of claim 10, wherein the optothermal substrate is translocated to illuminate the second location; wherein the electromagnetic radiation is provided by a light source, and the light source is translocated to illuminate the second location; wherein the electromagnetic radiation is provided by a light source, the light source being configured to illuminate a mirror and the mirror is configured to reflect the electromagnetic radiation from the artificial light source to illuminate the optothermal substrate, and the mirror is translocated to illuminate the second location; or a combination thereof.

12. The method of claim 1, further comprising removing the patterned two-dimensional atomic layer material from the optothermal substrate by etching the optothermal substrate, thereby creating a free-standing patterned two-dimensional atomic layer material.

13. The method of claim 12, further comprising depositing the free-standing patterned two-dimensional atomic layer material onto a substrate.

14. A patterned two-dimensional atomic layer material made using the method of claim 1.

15. A method of use of the patterned two-dimensional atomic layer material of claim 14, wherein the patterned two-dimensional atomic layer material is used for optical devices, electronic devices, optoelectronic devices, or combinations thereof.

16. The method of claim 1, wherein the optothermal substrate comprises a plurality of plasmonic particles.

17. The method of claim 16, wherein the plurality of plasmonic particles are a plurality of metal particles, the plurality of metal particles comprising a metal selected from the group consisting of Au, Ag, Pd, Pt, Cu, Cr, Al, Mg, Ni, and combinations thereof.

18. A system for patterning a two-dimensional atomic layer material, the system comprising:
an optothermal substrate in thermal contact with a two-dimensional atomic layer material, wherein the optothermal substrate comprises a plasmonic substrate having a plasmon resonance energy; and
a light source configured to illuminate the optothermal substrate at a first location with electromagnetic radiation, wherein the electromagnetic radiation has a power density of from 0.1 mW/μm$^2$ to 5 mW/μm$^2$ and the electromagnetic radiation comprises a wavelength that overlaps with at least a portion of the plasmon resonance energy of the plasmonic substrate, such that the optothermal substrate converts at least a portion of the electromagnetic radiation into thermal energy via plasmon-enhanced photothermal effects;
thereby:
generating an ablation region at a location of the two-dimensional atomic layer material proximate to the first location of the optothermal substrate via plasmon-enhanced photothermal effects, wherein at least a portion of the ablation region has a temperature sufficient to ablate at least a portion of the two-dimensional atomic layer material within the ablation region; and
ablating at least a portion of the two-dimensional atomic layer material within the ablation region proximate to the first location of the optothermal substrate,
thereby patterning the two-dimensional atomic layer material.

19. The system of claim 18, further comprising an instrument configured to capture an electromagnetic signal from the optothermal substrate and/or the two-dimensional atomic layer material.

20. The system of claim 19, further comprising a computing device comprising a processor and a memory operably coupled to the processor, the memory having further computer-executable instructions stored thereon that, when executed by the processor, cause the processor to:
receive an electromagnetic signal from the instrument;
process the electromagnetic signal to obtain a characteristic of the optothermal substrate and/or the two-dimensional atomic layer material; and
output the characteristic of the optothermal substrate and/or the two-dimensional atomic layer material.

* * * * *

UNITED STATES PATENT AND TRADEMARK OFFICE
CERTIFICATE OF CORRECTION

PATENT NO. : 11,448,965 B2  
APPLICATION NO. : 17/262015  
DATED : September 20, 2022  
INVENTOR(S) : Yuebing Zheng et al.

Page 1 of 1

It is certified that error appears in the above-identified patent and that said Letters Patent is hereby corrected as shown below:

In the Claims

Column 27, Claim 9, Line 12 should read:
"…time of $10^{-4}$ seconds to 10 seconds."

Signed and Sealed this  
Third Day of January, 2023

Katherine Kelly Vidal  
*Director of the United States Patent and Trademark Office*